(12) United States Patent
Tanaka et al.

(10) Patent No.: US 7,291,929 B2
(45) Date of Patent: Nov. 6, 2007

(54) SEMICONDUCTOR DEVICE AND METHOD OF MANUFACTURING THEREOF

(75) Inventors: Naotaka Tanaka, Kasumigaura (JP); Yasuhiro Yoshimura, Kasumigaura (JP); Takahiro Naito, Kodaira (JP); Takashi Akazawa, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/329,600

(22) Filed: Jan. 10, 2006

(65) Prior Publication Data
US 2006/0170112 A1    Aug. 3, 2006

(30) Foreign Application Priority Data
Jan. 31, 2005    (JP)    ............................. 2005-022478

(51) Int. Cl.
*H01L 23/48*    (2006.01)
(52) U.S. Cl. ...................... 257/784; 438/108; 257/698; 257/E23.169
(58) Field of Classification Search ................ 257/686, 257/688, 698, 737, 777, 778, 785, 784; 438/108, 438/109, 618
See application file for complete search history.

(56) References Cited

U.S. PATENT DOCUMENTS

2005/0263869 A1*    12/2005    Tanaka et al. .............. 257/686

* cited by examiner

*Primary Examiner*—Quoc Hoang
(74) *Attorney, Agent, or Firm*—Townsend and Townsend and Crew LLP

(57) ABSTRACT

A connection method is disclosed for a high-performance semiconductor system. The connection method enables high-speed operation with low noise, so as to obtain reliable and excellent connection in a short TAT at low costs. Semiconductor chips and the interposer chips are polished by grinding at their rear surfaces, holes are formed at rear surface positions corresponding to external electrode parts on the device side (front surface side) so that the holes extend to front surface electrodes, and metal plating films are applied to the side walls of the holes and rear surface side. Metal bumps of another semiconductor chip laminated at an upper stage being press-fitted into the holes applied with the metal plating films through deformation and being geometrically calked in the through holes formed in the semiconductor chip so as to electrically connected thereto.

12 Claims, 31 Drawing Sheets

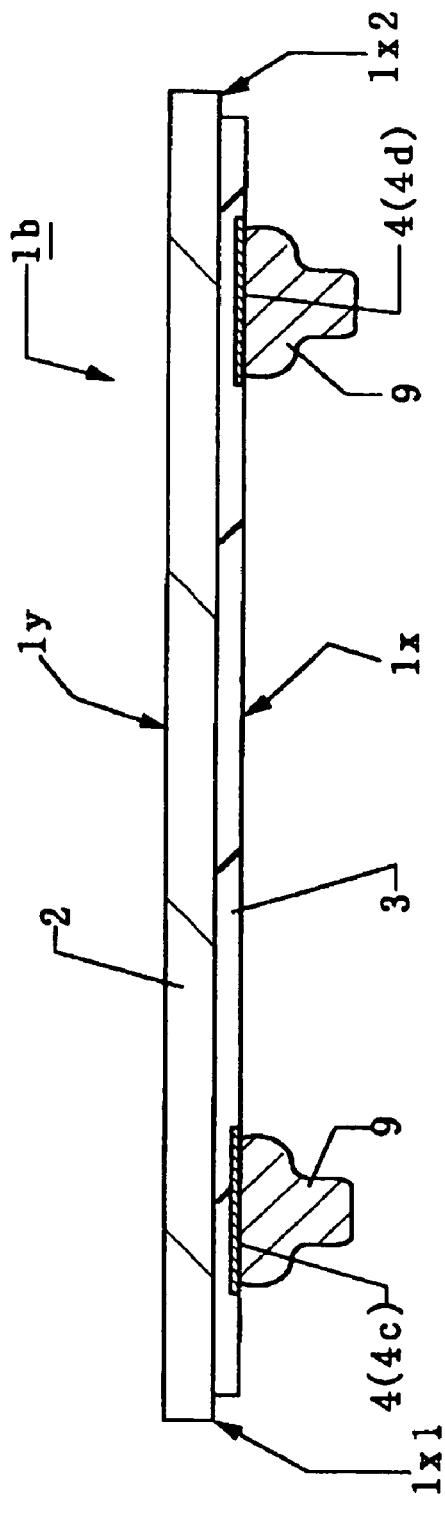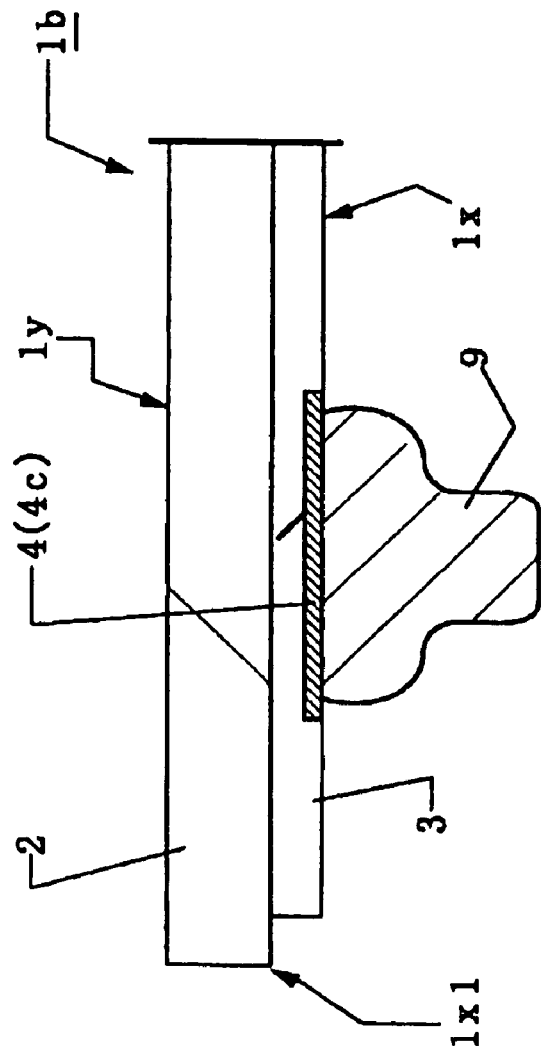

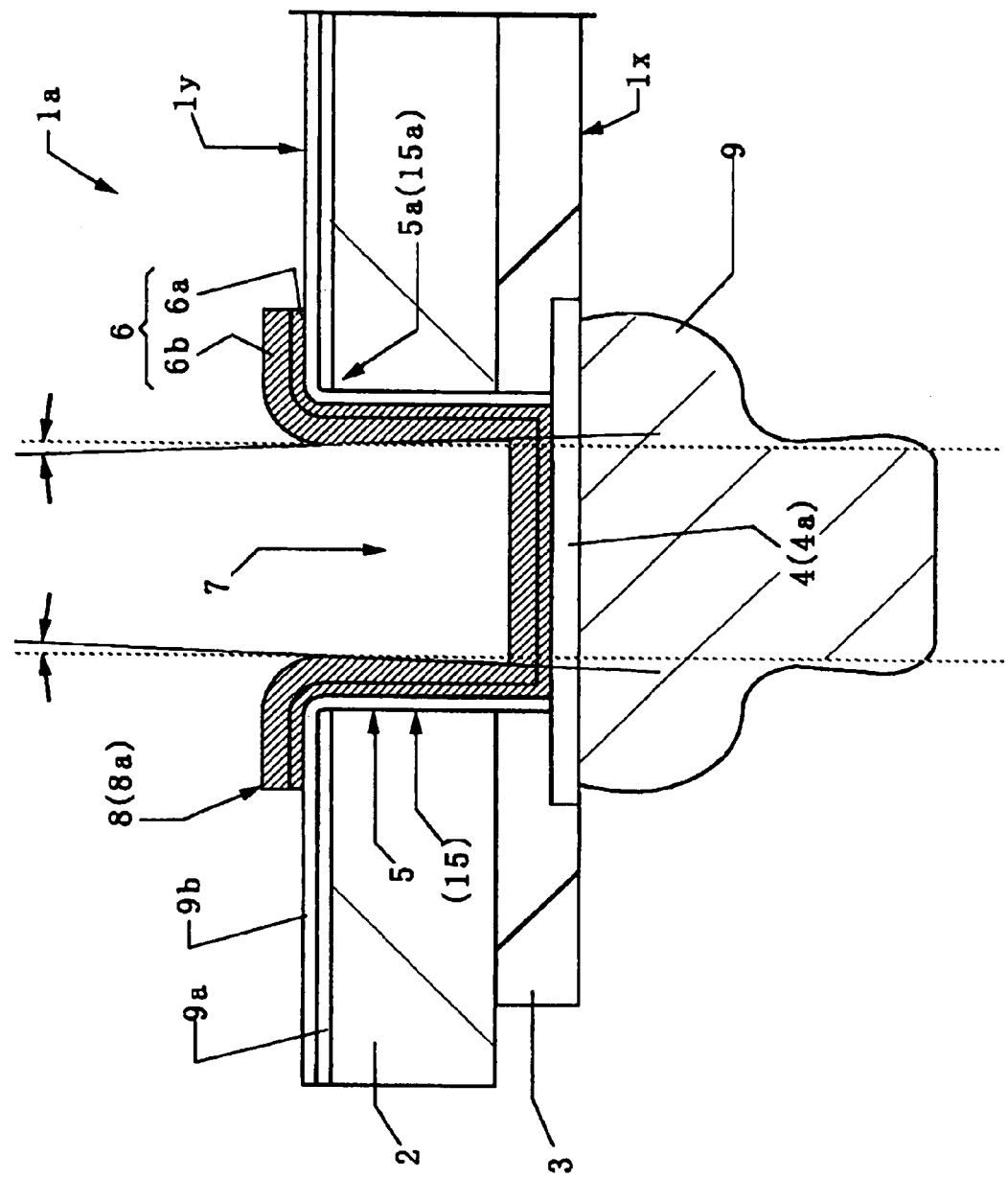

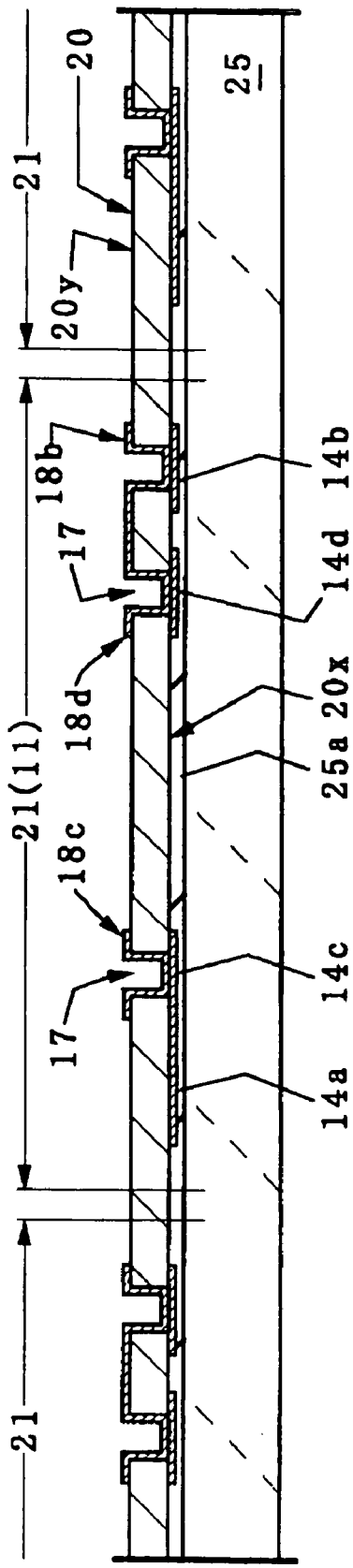
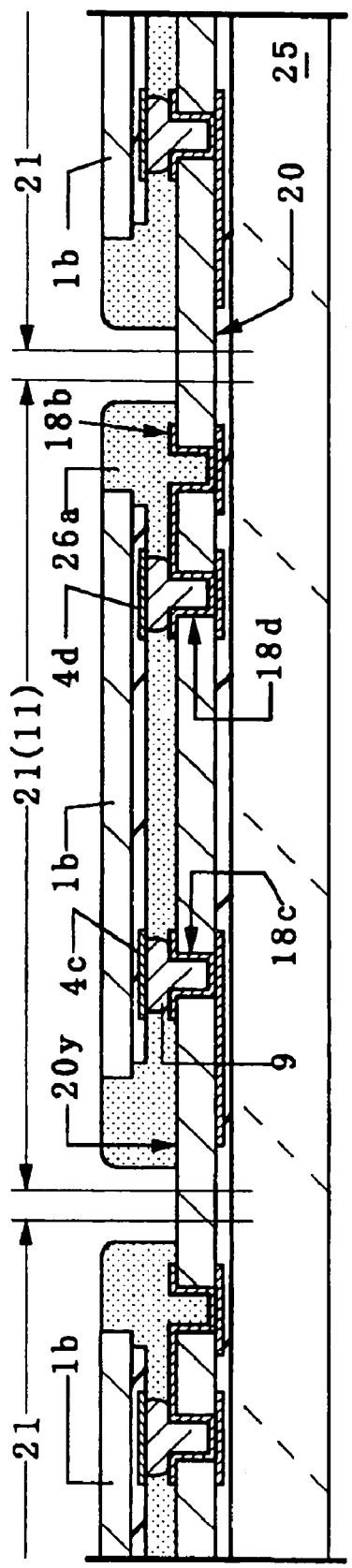
FIG.13a
FIG.13b

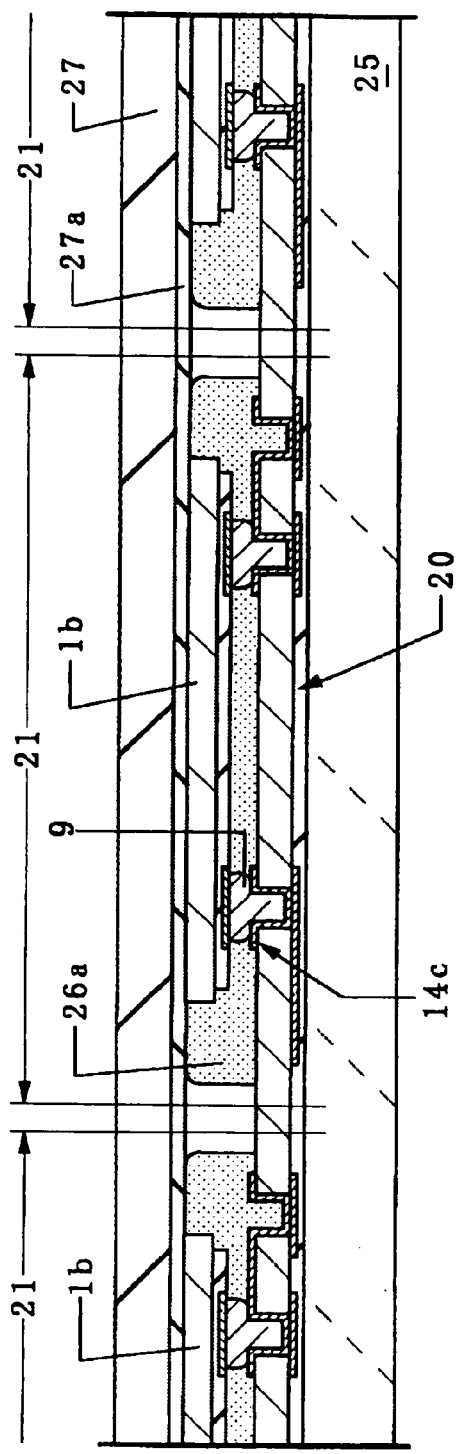
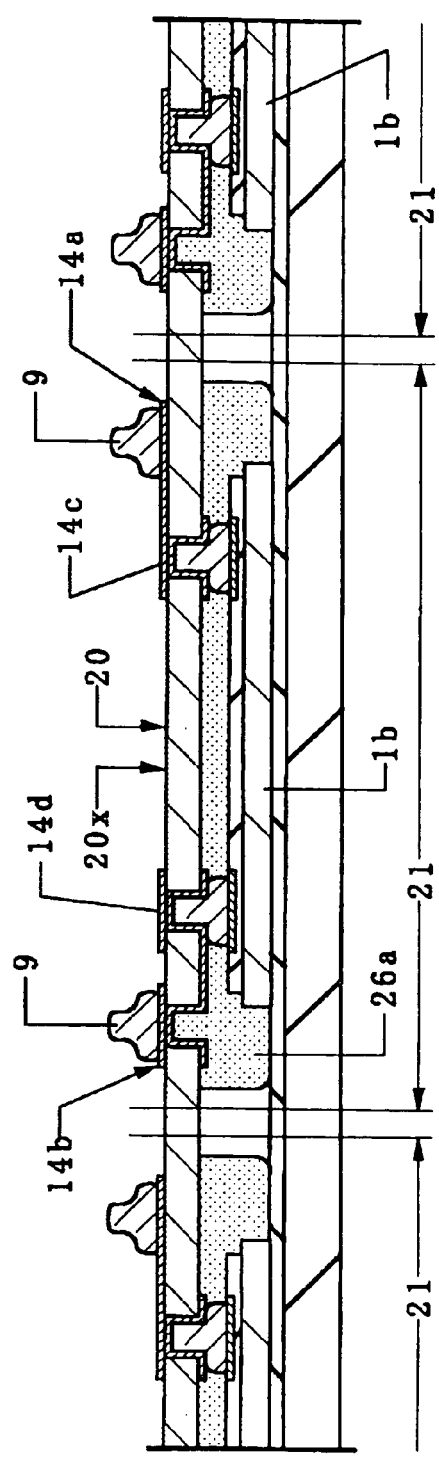
FIG.14a
FIG.14b

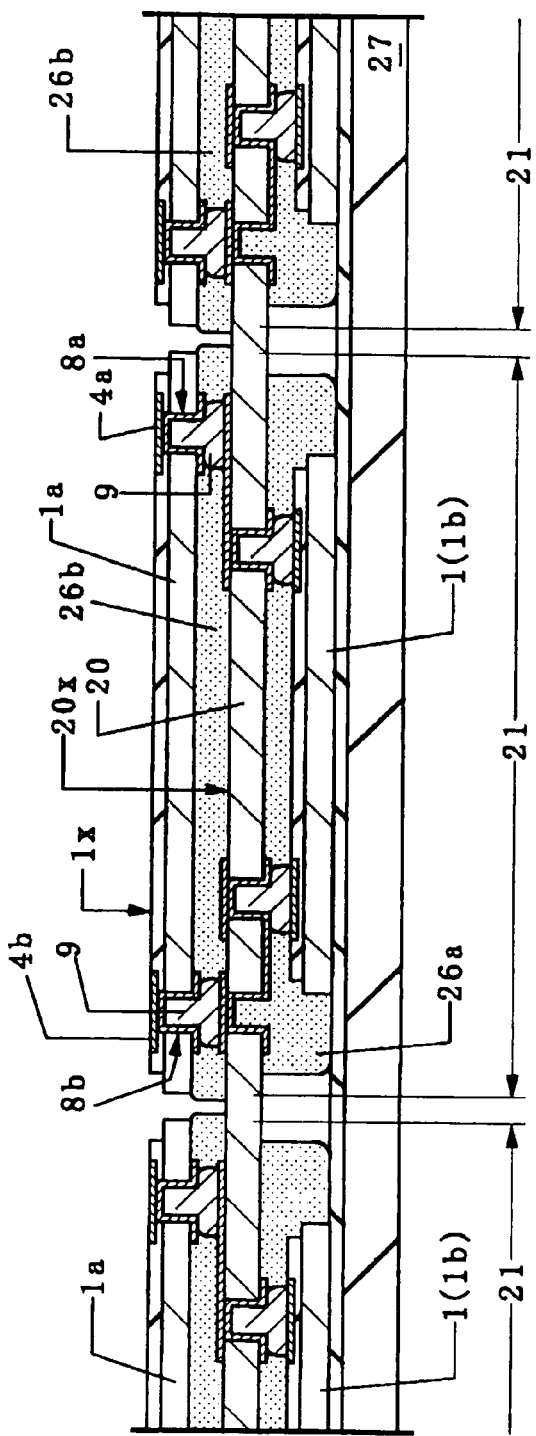
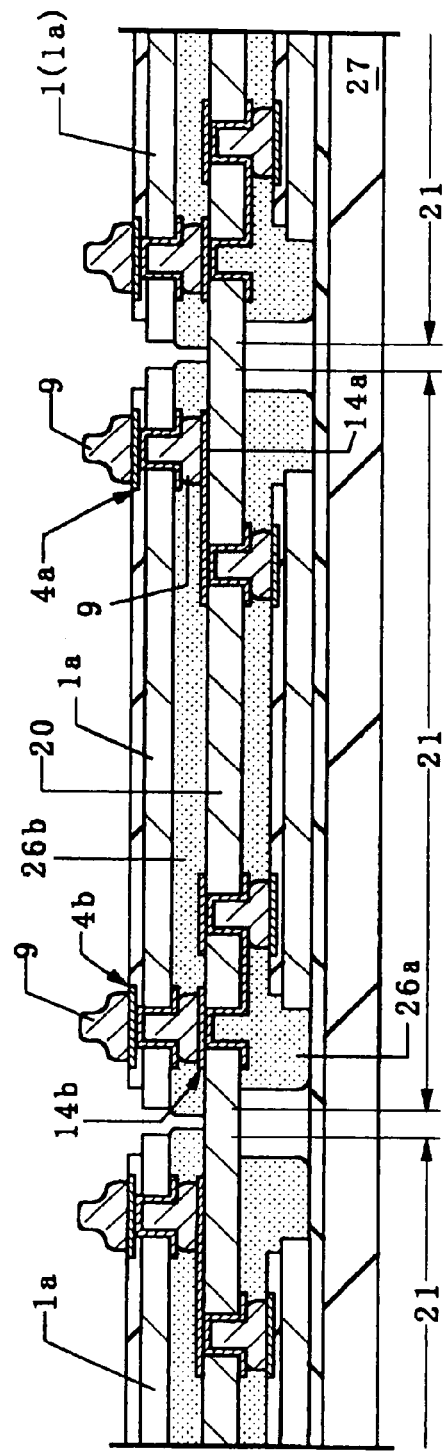
FIG.15a
FIG.15b

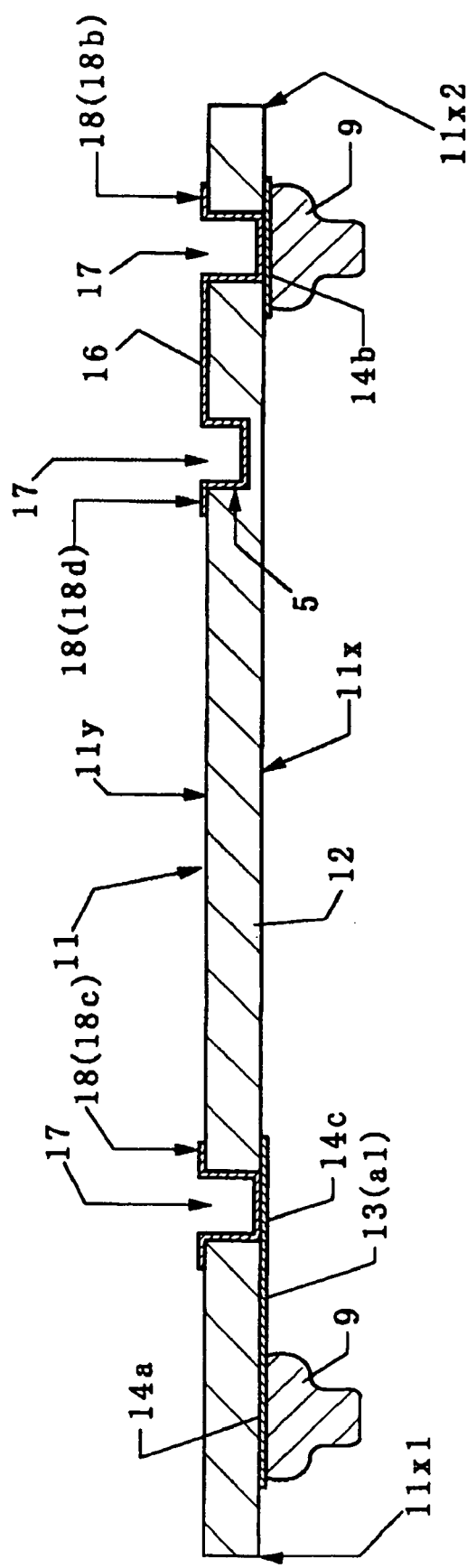

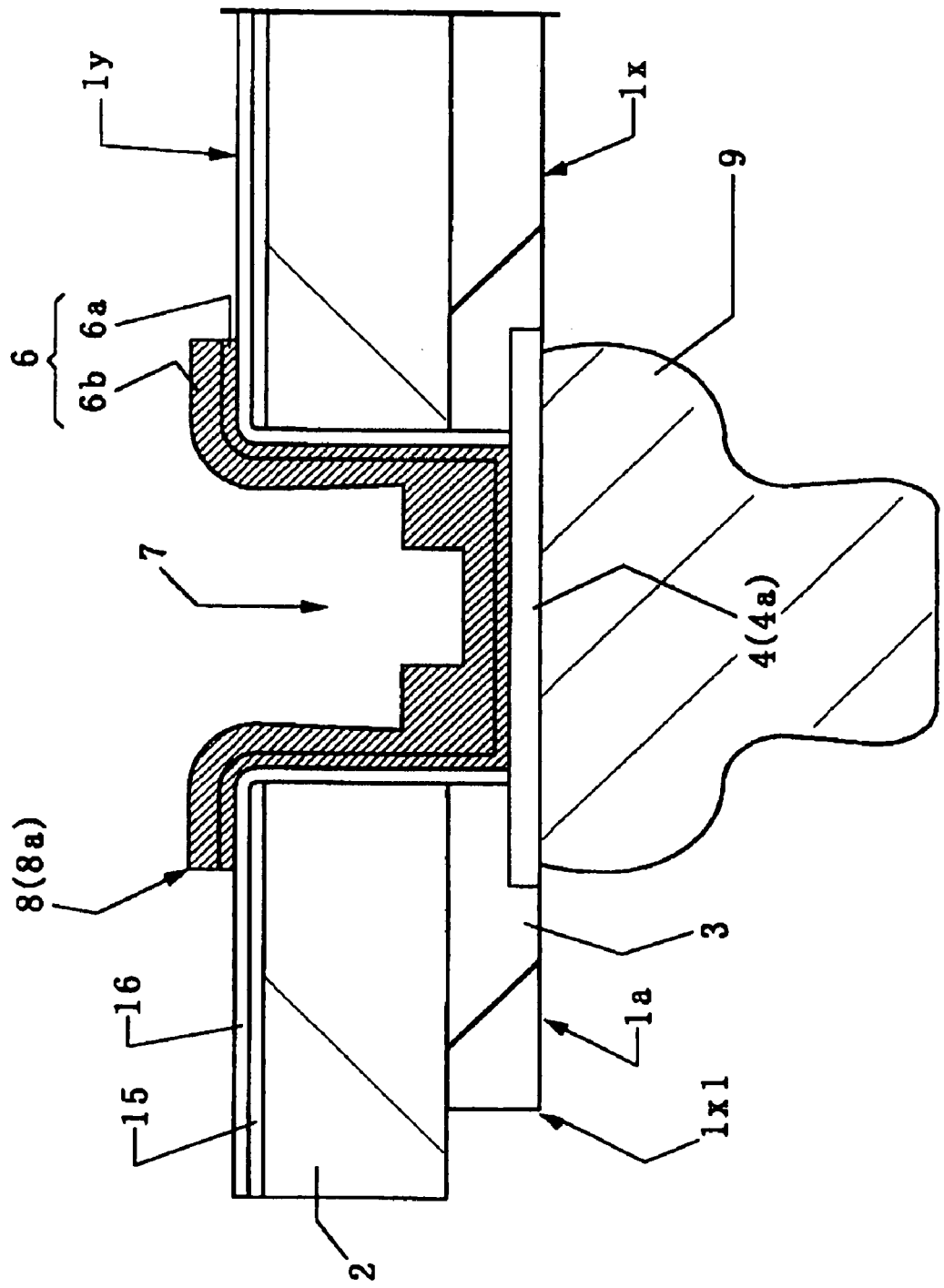

SEMICONDUCTOR DEVICE AND METHOD OF MANUFACTURING THEREOF

BACKGROUND OF THE INVENTION

The present invention relates to a semiconductor device having a plurality of semiconductor chips which are three-dimensionally laminated one upon another.

These years, there has been spotlighted to a technology of system packages in which several semiconductor chips incorporated therein integrated circuits are densely packaged, and which have a high performance, and accordingly, several firms have proposed several various packaging configurations. In particular, there have been prosperously developed laminated packages in which several semiconductor chips are three-dimensionally packaged so as to be allow the packages to be comparatively small-sized.

Since wire-bonding is in general utilized for electrical connection between a substrate and a semiconductor chip mounted thereon, it is required that the sizes of the semiconductor chips to be laminated one upon another are set, the higher the laminated stage, the smaller the size of the semiconductor chip. Accordingly, in order to laminate semiconductor chips having substantially equal sizes, spacers should be interposed therebetween so as to ensure areas for wire-bonding. The connection of the wire-bonding has a high degree of freedom of wiring lay-out, and accordingly, is extremely effective for practical electrical connection for a plurality of existing semiconductor chips in a short TAT (Turn Around Time).

However, the wire-bonding connection requires such a process that all wirings from a plurality of electrodes of semiconductor chips are once led onto a mounting substrate, and thereafter, rewiring is made for one of the chips. Thus, there have been raised a problem of a long wiring length between the chips, and a problem of an extremely high wiring density on the mounting substrate. Thus, an inductance between chips is increased, and accordingly, high speed transmission becomes difficult. Further, the high wiring density on the mounting substrate causes a lower yield, resulting in an increase in the costs of the mounting substrate. Thus, there may be raised not only such a problem that an inductance between the chips increases so as to cause difficulty in high speed transmission and but also such a problem that the higher density of the mounting substrate deteriorates the yield so as to increase the substrate costs.

In view of the above-mentioned problems caused by the wire bonding connection, there has bee proposed a method for carrying out connection between chips with no intervention of a mounting substrate. As disclosed in JP-A-2001-217385, there has been proposed such a method that semiconductor chips are applied thereto with wiring tapes which are tape carrier-like and which have wiring layers with predetermined patterns, at their upper and lower surfaces and at their one side surface, these surfaces being incorporated thereto with external connection terminals, so as to form a package structure capable of connecting the upper and lower chips laminated one upon anther, therebetween. Although this method is a conventionally known package lamination type one in which chips individually packaged are connected by means of external electrodes, three dimensional lamination can be made having a size substantially equal to that of the chip by improving this conventional method. However, due to a laminated structure in which individual packages are laminated one upon another, there have been raised such problems that a wiring length becomes longer between chips, and that the freedom in the case of lamination of different kinds of chips having different sizes has to be limited.

On the contrary, as disclosed in JP-A-11-251316 and JP-A-2000-260934, there have been proposed such methods that electrodes are formed in chips, piercing therethrough so as to connect between upper and lower chips. JP-A-11-251316 discloses a process of manufacturing a semiconductor device using, for example, copper wirings, in which copper piercing electrodes are also formed, so as to provide a semiconductor chip with piercing electrodes that can greatly simplify the manufacturing process. The JP-A-2000-260934 discloses such a method that electrodes which are formed by embedding solder or low melting point metal in through-holes in a chip by electroplating or electroless plating at upper and lower parts of the chips, and the chips are heated, after they are laminated one upon another, so as to melt and fuse the embedded electrodes in order to three-dimensionally connect the chips with one another.

As stated above, the method using wire bonding has been in general used as a method of tree-dimensionally laminating a plurality of semiconductor chips for packaging. However, there will be caused in future such a problem that the wiring length causes a bottle neck problem in view of high speed transmission and miniaturization and thinning of the package in view of ensuring its bonding area. Thus, as a method instead thereof, there has been proposed a three-dimensional connection between chips by shortest wirings using piercing electrodes. Since a process of forming piercing electrodes in a silicon substrate is a novel one which has not yet been used in a wafer process or a mounting process, there have been required, as a premise of introduction thereof, a low process load, a short TAT, simple connection, and such reliability as has been conventionally available.

The process of manufacturing a devise, as disclosed in the JP-A-11-251316, in which copper piercing electrodes are simultaneously formed, is effective for reducing the process load, but reference dimensions between a devise manufacturing process and a mounting process are different from each other by not less than two figures. Accordingly, should the piercing electrodes to be used for connection between chips by a mounting process, be formed also in the devise manufacturing process, there would be caused problems of lowering a yield and a TAT as to the manufacture of devices.

Further, as disclosed in JP-A-2000-260934, in a method in which bump electrodes are formed in through holes in chips through plating growth, there would be raised a problem of taking a relatively long time for the plating growth (several hours) and a problem of incurring technical difficulty in uniform plating growth including through-holes having a high aspect ratio.

Further, different from a method using wire bonding, semiconductor chips which are laminated on the upper stage side are not directly connected to external electrodes through the intermediary of mounting substrates. Accordingly, it is required to manifest a process of wiring between upper and lower chips, which enables operation of the upper stage side semiconductor chip. For example, with such a structure that different kinds of semiconductor chips are laminated one upon another, operating voltages are possibly different from one another. Further, with a multi-stage lamination structure of the same kind of chips, there would be caused a problem of chip select for the upper stage semiconductor chip.

SUMMARY OF THE INVENTION

The present invention is devised in order to eliminate the above-mentioned problems inherent to the prior art, and an object of the present invention is to provide a method of connecting semiconductor chips therebetween with the use of piercing electrodes formed in the chips, which can materialize the connection in a short TAT and at low costs.

Thus, in order to connect semiconductor chips therebetween with the use of piercing electrodes formed in the chips in a short TAT and at low costs, there is provided a method comprising the steps of thinning a chip to a predetermined thickness through back-grinding or the like, forming, by dry etching, holes in the rear surface of the chip at positions corresponding to device side external electrode parts so as to cause the holes to extend to front surface side electrodes, applying metal plating films at side surfaces of the holes and therearound on the rear surface side, pressing metal bumps formed on electrodes of another semiconductor chip laminated therewith at a stage thereabove, into the holes applied with the plating films, bumps being deformed and filled in the holes so as to geometrically calk the metal bumps in the holes formed in the chip in order to electrically connect the metal bumps thereto, and finally filling and curing an adhesive such as underfill in a gap between the upper and lower chips which are connected through the bumps.

If different kinds of semiconductor chips are laminated open upon another with the use of the above-mentioned connecting method, there is provided between chips, for example, such a three-dimensional connecting structure that an interposer chip (an intermediate wiring substrate) is interposed between the chips, having a front surface layer side which is formed thereon with a rewiring pattern for connecting signal pines of the different kinds semiconductor chips therebetween, and a rear surface layer side electrically connected to front surface layer side electrode parts through the intermediary of the piercing electrode parts, which is formed thereon with a plane layer (or a rewiring layer) for a power source between the upper and lower chips and ground wiring.

The method according to the present invention may exhibits the following advantages and features:

(1) the holes are not filled with electrolytic plating but the thin metal plating film is only formed in the rear surface side electrode parts including the side walls of the holes, the necessity of a plating filling steps incurring a long time, and a subsequent CMP (Chemical Mechanical Polishing) process may be eliminated, thus, the manufacturing process may be carried out in a short TAT at low costs;

(2) the metal bumps fitted in the piercing electrodes hole through plastic flow during pressing, is stably held being joined with the plating electrodes in the piercing electrode holes through their spring-back action, and accordingly, the electrical connection can be materialized by pressing at a room temperature. Further, the metal bumps have a linear expansion coefficient which is a larger than that of Si, and accordingly, calking may be obtained by a thermal expansion difference even during reflow heating, thereby it is possible to maintain a stable connection even at a high temperature;

(3) The process of connecting the chips may be carried out by equipments similar to those used in a pressing process with the use of conventional gold (Au) stud bumps, and further, a heating process is not always required;

(4) The connection between the upper and lower chips may be made with no mounting substrate therebetween, different from a method using wire-bonding, and accordingly, the mounting substrate has to be formed with only a wiring layer which is connected from a lowermost semiconductor chip to external electrodes, thereby it is possible to constitute a structure of two or four layer substrates. Accordingly, in comparison with currently used substrates which are formed of a multilayered build-up substrate, it is possible to aim at thinning a semiconductor device and lowering the costs thereof; and (5) In the case of lamination of different kinds of semiconductor chips, an interposer chip interposed, for example, between upper and lower chips in lamination may be formed even on the rear surface side with a rewiring layer, simultaneously, within a process range in which the piercing electrodes are formed. Thus, a two layer wiring layout may be substantially made, and accordingly, an inexpensive chip configuration having only one aluminum surface wiring layer may be normally used as the interposer chip.

Brief explanation will be hereinbelow made of advantages which may be obtained typical ones of the inventions disclosed in the present application:

A plurality of LSI chips (semiconductor chips) which are solidly (three-dimensionally) laminated one upon another may be connected three-dimensionally with shortest wiring lengths, thereby it is possible to exhibit the following technical effects:

(1) The holes are not filled therein with electrolytic plating or the like but a thin metal plating film is formed only in the rear surface side electrode parts including the side wall of the holes, the necessity of a plating filling process taking a long time and a subsequent CMP (Chemical Metal Polishing) process may be eliminated, thereby it is possible to manufacture a semiconductor device in a short TAT at low costs;

(2) The metal bumps fitted in the piercing electrodes holes through deformation caused by plastic flow during pressing, is stably held being joined with the plating electrode in the piercing electrode holes through their spring-back action, and accordingly, the electrical connection can be materialized by pressing at a room temperature. Further, the metal bumps have a linear expansion coefficient which is a larger than that of Si, and accordingly, calking may be obtained due to a thermal expansion difference even during reflow heating, thereby it is possible to maintain a stable connection even at a high temperature;

(3) The process of connecting between the chips may be carried out by equipments similar to those used in a pressing process with the use of conventional gold stud bumps, and further, a heating process is not always required.

(4) The connection between the upper and lower chips may be without through a mounting substrate, different from a method using wire-bonding, and accordingly, the mounting substrate may be formed with only a wiring layer which is connected from a lowermost semiconductor chip to external electrodes, thereby it is possible to constitute a structure of two or four layer substrates. Accordingly, in comparison with currently used substrates which are formed of multilayered build-up substrates, it is possible to aim at thinning a semiconductor device and lowering the costs thereof; and (5) In the case of lamination of different kinds of semiconductor chips, an interposer chip interposed, for example, between upper and lower chips in lamination may be formed even on the rear surface side with a rewiring layer, simultaneously, within a process range in which the piercing electrodes are formed. Thus, a two layer wiring layout may be substantially made, and accordingly, an inexpensive chip configuration having only one aluminum surface wiring layer may be normally used as the interposer chip. That is, in comparison with a connecting process, as disclosed in the prior art documents, with the use of piercing electrodes, a configuration and a process which are extremely inexpensive with a short TAT may be used, and an unique connection structure with a high degree of reliability may be materialized due to calking with the use of deformation of the metal bumps caused by plastic flow, thereby it is possible to provide a configuration of three-dimensional inter-chip connection which is highly practical.

Other objects, features and advantages of the invention will become apparent from the following description of the embodiments of the invention taken in conjunction with the accompanying drawings.

BRIEF DESCRIPTION OF SEVERAL VIEWS OF THE DRAWINGS

FIG. 3a is a schematic sectional view illustrating an entire configuration of a semiconductor chip located at the lowermost stage in a chip lamination shown in FIG. 1:

FIG. 3b is an enlarged schematic sectional view illustrating a part in FIG. 3a;

FIG. 4a is a schematic sectional view illustrating an entire configuration of a semiconductor chip located at the uppermost stage in the chip lamination shown in FIG. 1;

FIG. 4b is an enlarged schematic sectional view illustrating a part in FIG. 4a;

FIG. 8 is a schematic enlarged view illustrating the electrode part shown in FIG. 3b;

FIG. 13a is a schematic sectional view for explaining the manufacture of the semiconductor device in the embodiment 1 of the present invention;

FIG. 13b is a schematic sectional view for explaining the manufacture of the semiconductor device in the embodiment 1 of the present invention;

FIG. 14a is a schematic sectional view for explaining the manufacture of the semiconductor device in the embodiment 1 of the present invention;

FIG. 14b is a schematic sectional view for explaining the manufacture of the semiconductor device in the embodiment 1 of the present invention;

FIG. 15a is a schematic sectional view for explaining the manufacture of the semiconductor device in the embodiment 1 of the present invention;

FIG. 15b is a schematic sectional view for explaining the manufacture of the semiconductor device in the embodiment 1 of the present invention;

FIG. 18 is a schematic sectional view illustrating a configuration of an interposer chip in a variant 1 of the embodiment 1 of the present invention;

FIG. 19 is a schematic sectional view illustrating a configuration of a concave electrode in a variant 2 of the embodiment 1 of the present invention;

FIG. 21b is a schematic plan view illustrating the concave electrode shown in FIG. 21a;

DESCRIPTION OF PREFERRED EMBODIMENTS OF THE INVENTION

Figure 1:
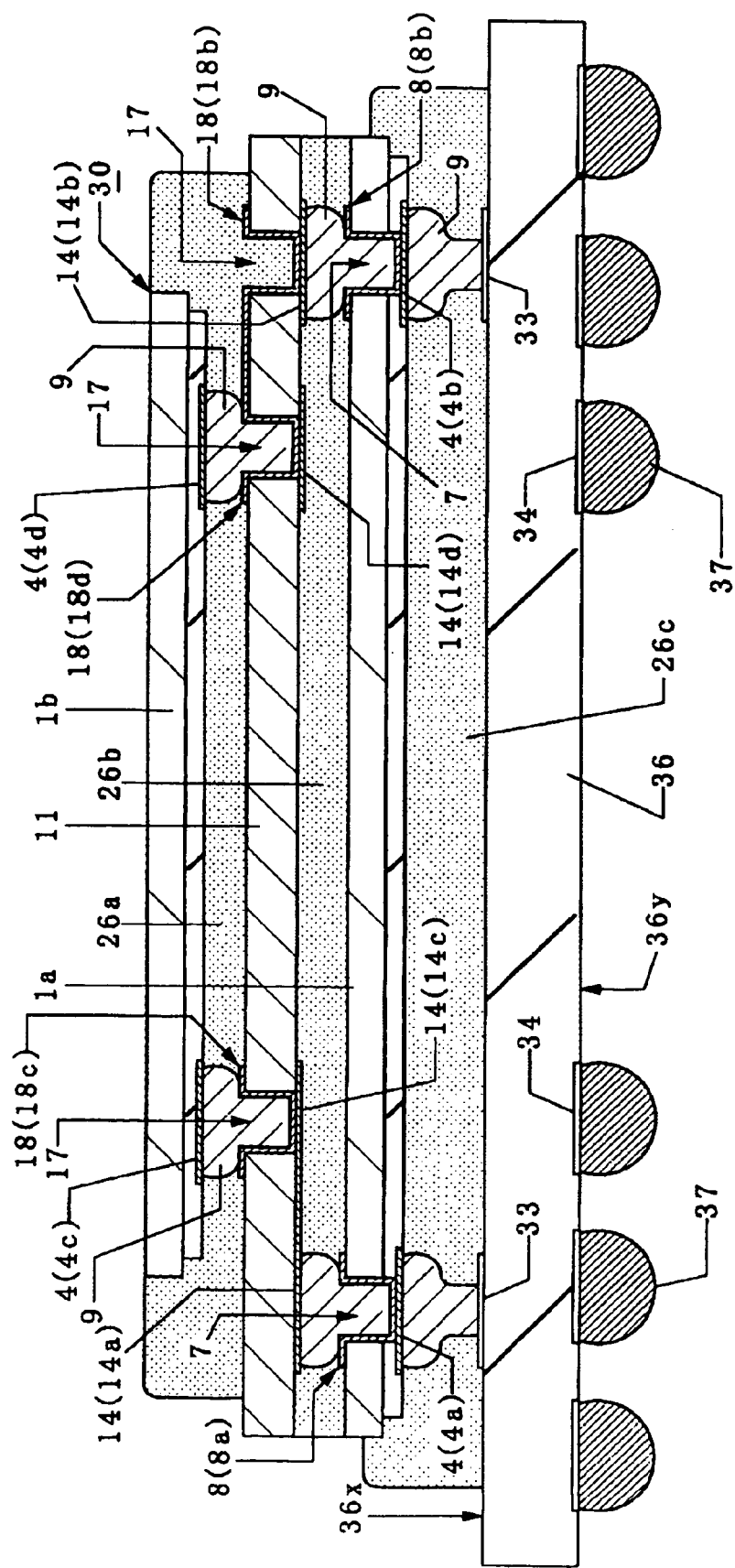
FIG. 1 is a schematic sectional view illustrating a configuration of a semiconductor device in an embodiment 1 of the present invention.

Explanation will be hereinbelow made of several embodiments of the present invention with reference to the accompanying drawings in which like reference numerals are used to denote like functional parts so as to abbreviate duplication of explanation thereto.

Embodiment 1

In the embodiment 1, a semiconductor device having a lamination in which different kinds of semiconductor chips are three-dimensionally laminated one upon another, an interposer chip (an intermediate wiring substrate) being interposed therebetween.

Figure 2:
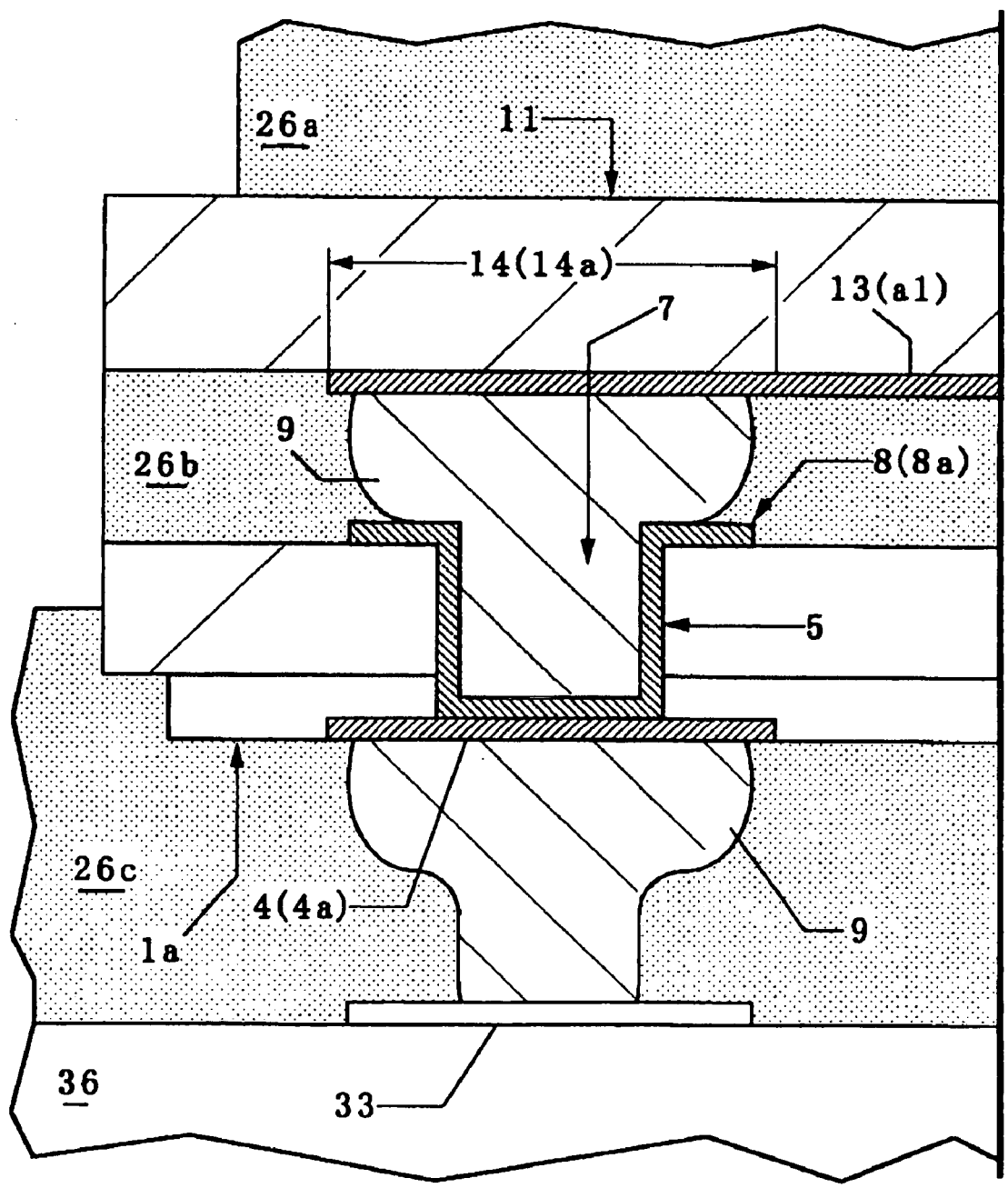
FIG. 2 is an enlarged schematic sectional view illustrating a part shown in FIG. 1.
Figures 3A, 3B:
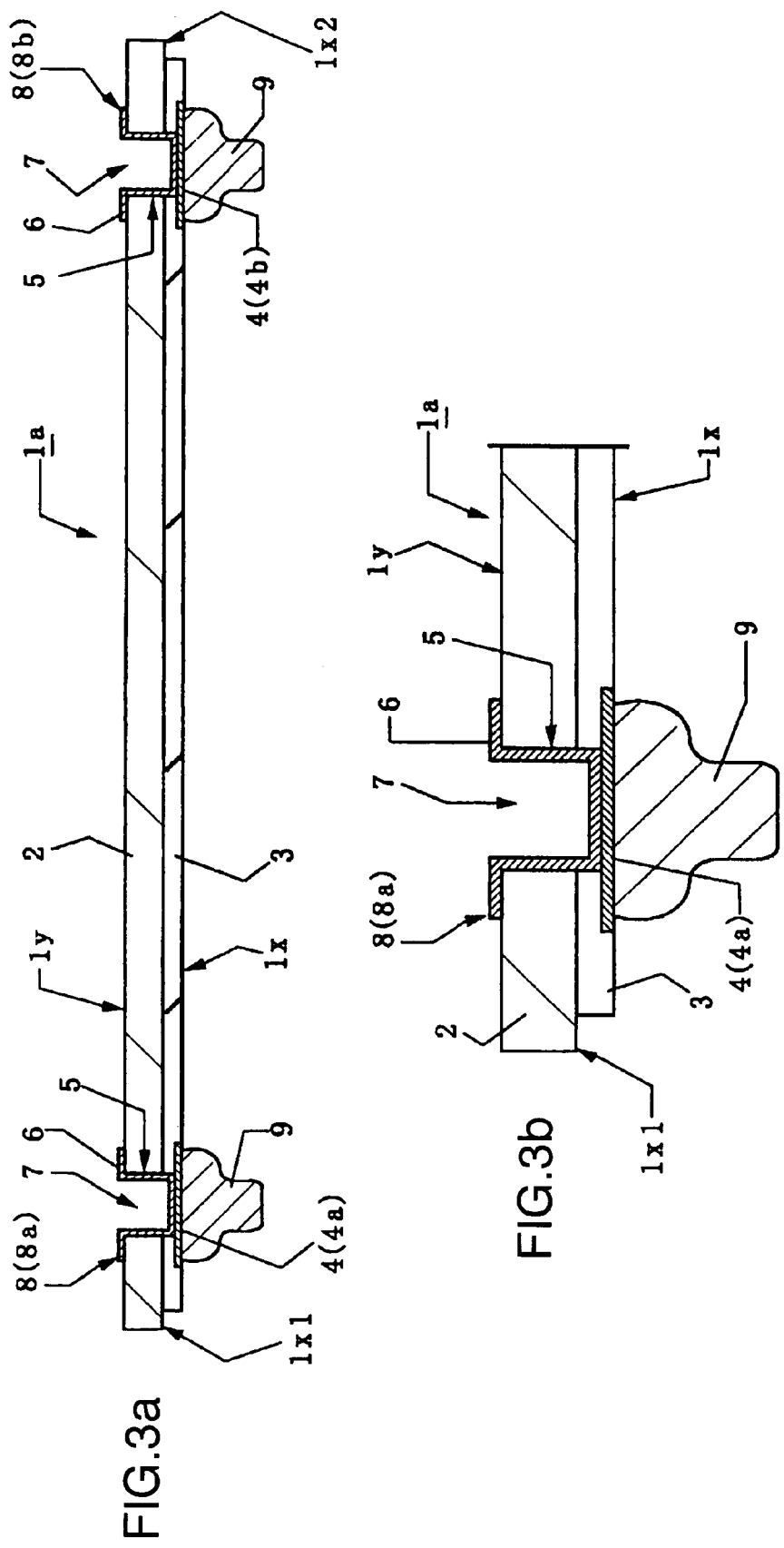
Figure 5:
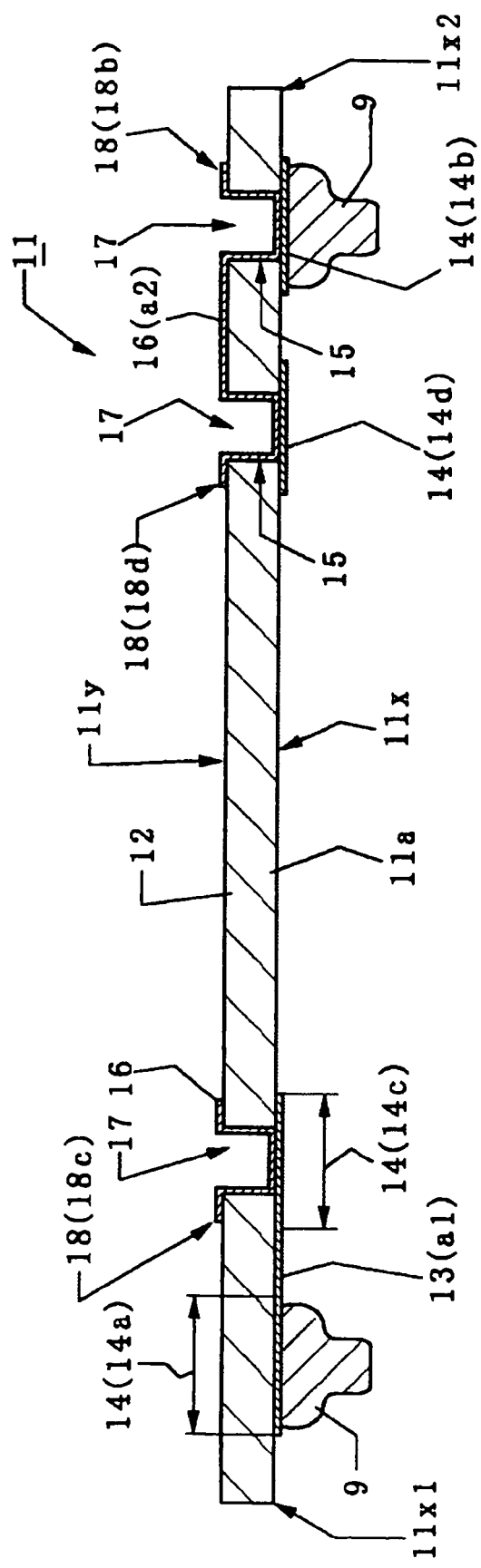
FIG. 5 is a schematic sectional view illustrating a configuration of an interposer chip interposed between the lowermost stage semiconductor chip and the uppermost stage semiconductor chip in the chip lamination shown in FIG. 1.
Figure 6A:
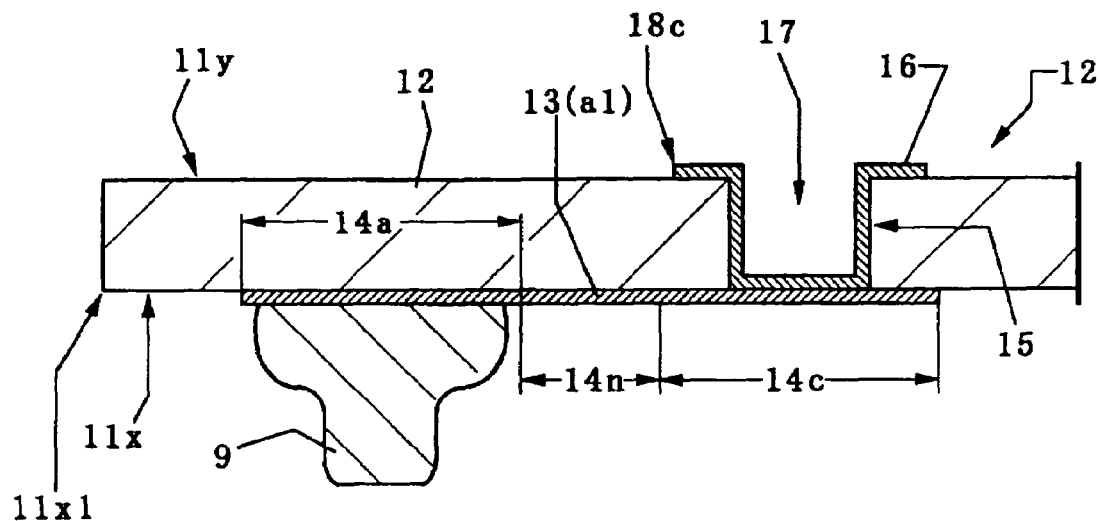
FIG. 6a is a schematic enlarged sectional view illustrating configuration of a left side electrode as viewed in FIG. 5.
Figure 6B:
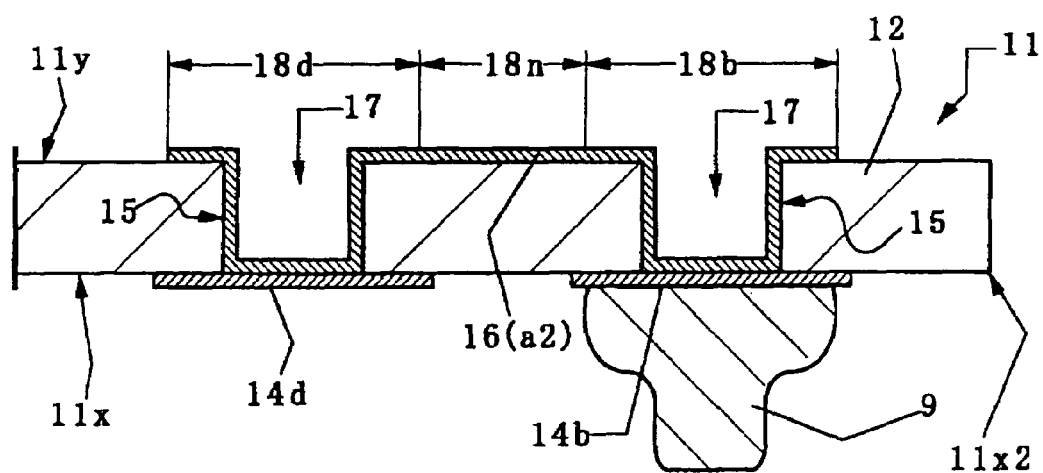
FIG. 6b is a schematic enlarged sectional view illustrating a configuration of a right side electrode as viewed in FIG. 5.
Figure 7A:
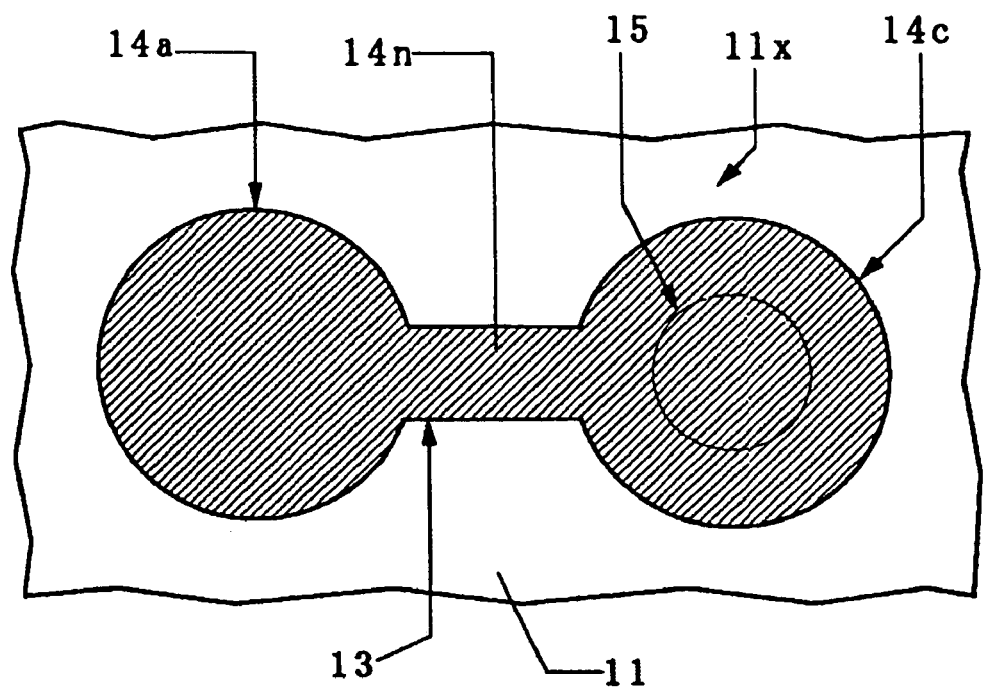
FIG. 7a is a schematic plan view illustrating an electrode part as viewed from the principal surface side of the interposer chip.
Figure 7B:
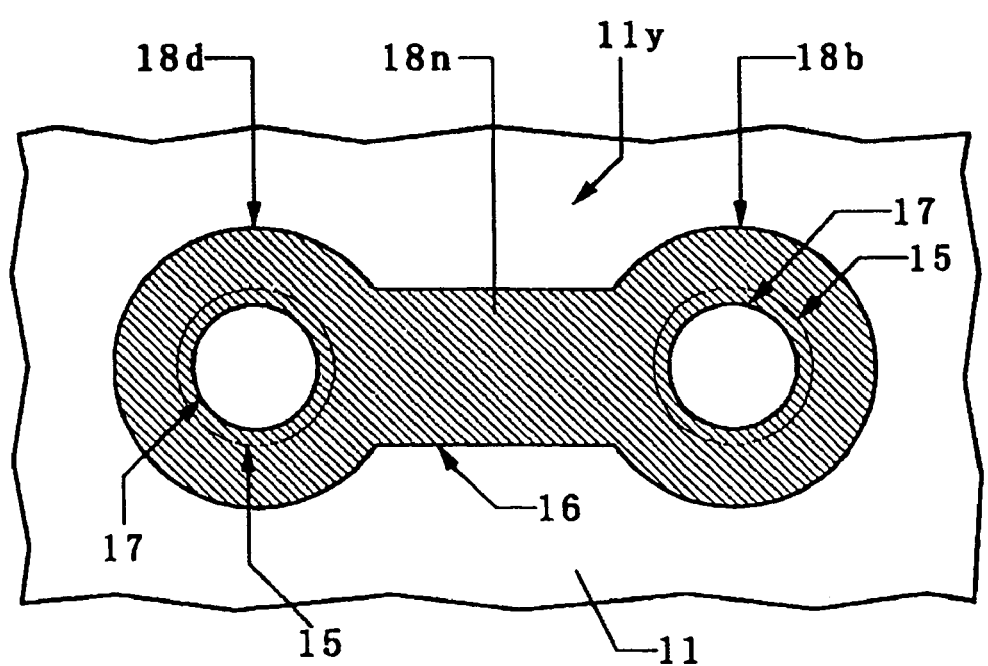
FIG. 7b is a plan view illustrating the electrode part as viewed from the rear surface side of the interposer chip.
Figure 9A:
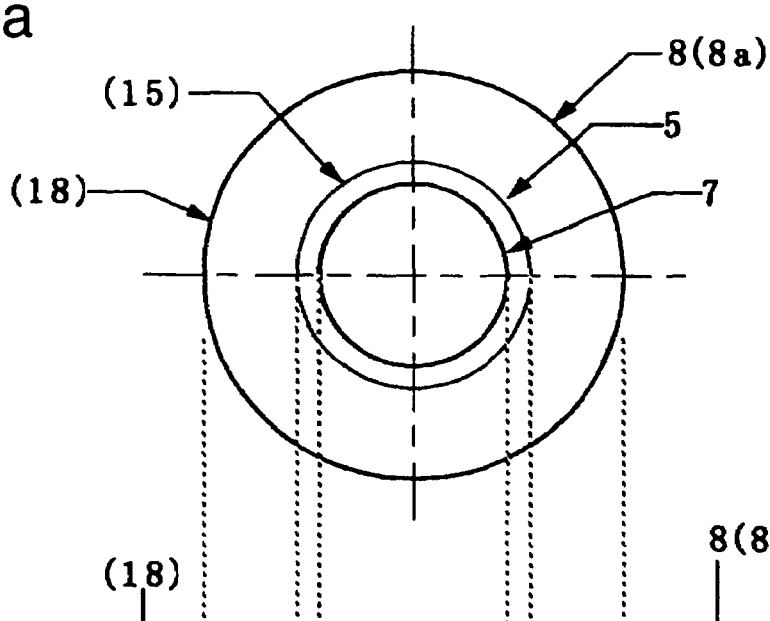
FIG. 9a is a schematic plan view illustrating a configuration of a concave electrode shown in FIG. 8.
Figure 9B:
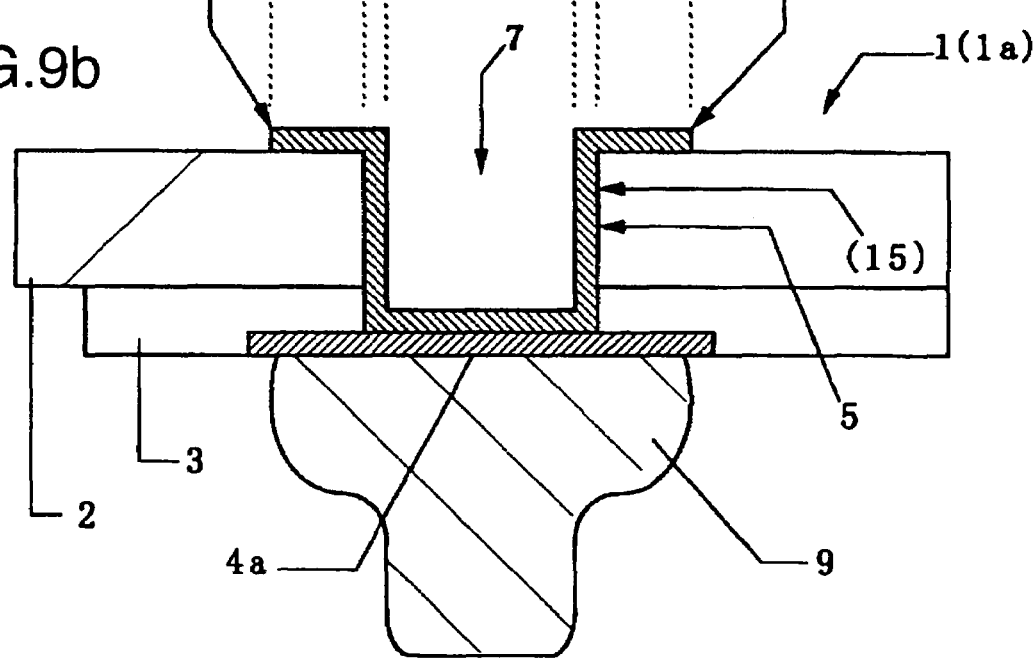
FIG. 9b is a schematic sectional view illustrating the configuration of the concave electrode.
Figure 10:
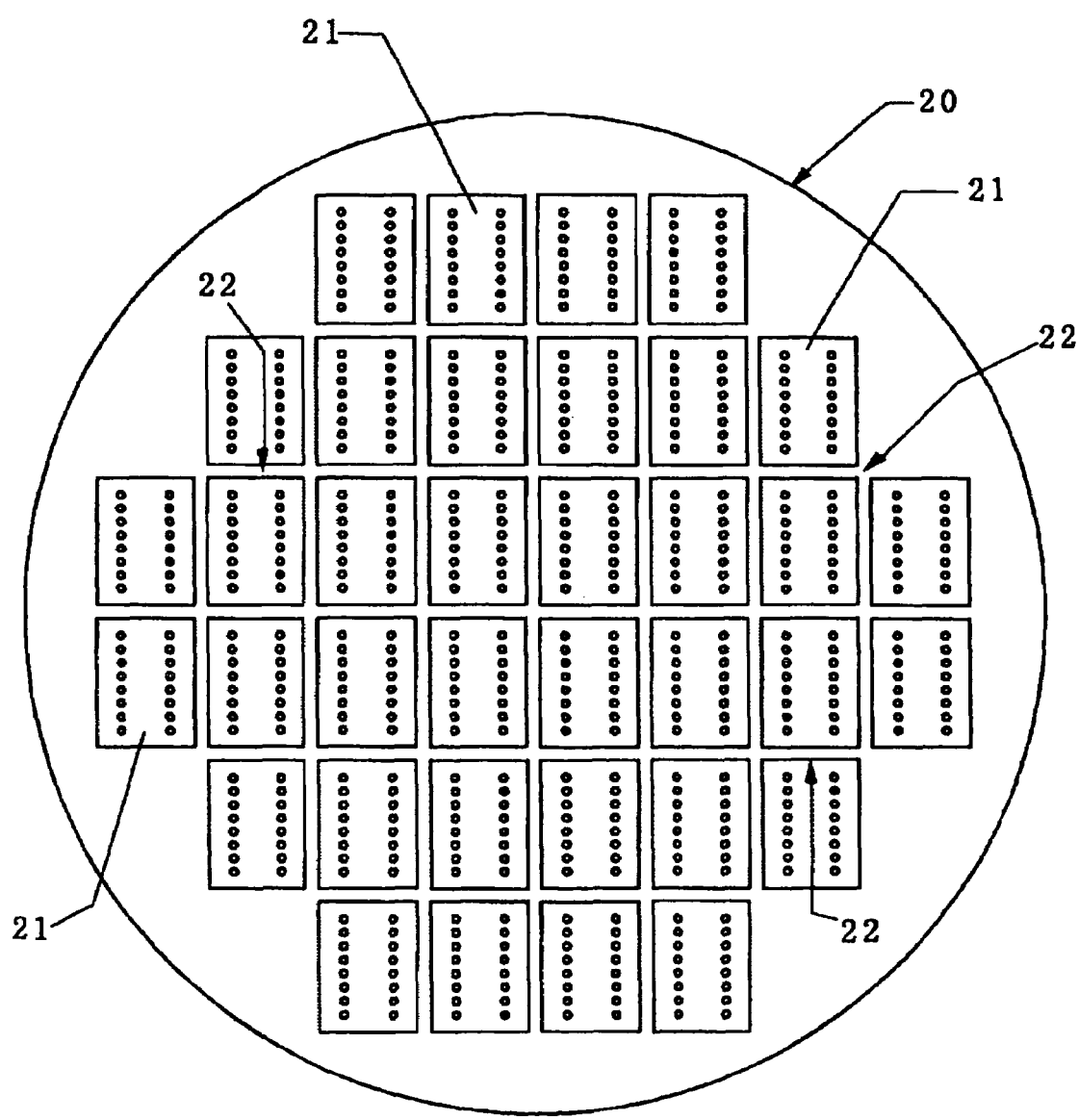
FIG. 10 is a schematic plan view illustrating a semiconductor wafer used for manufacturing the semiconductor device in the embodiment 1 of the present invention.
Figure 11:
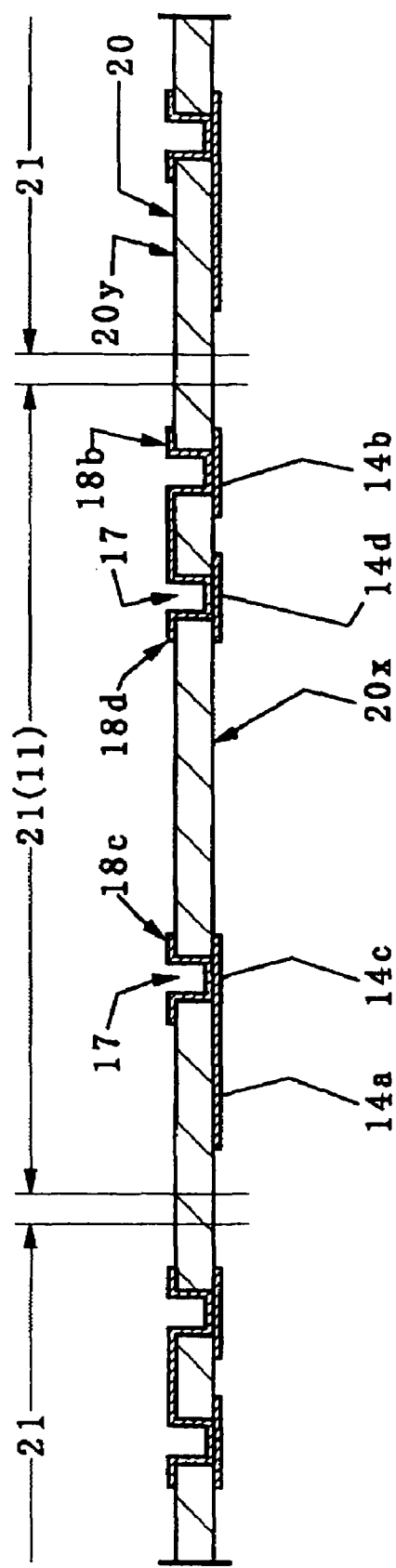
FIG. 11 is a schematic sectional view illustrating the semiconductor wafer shown in FIG. 10.
Figure 12:
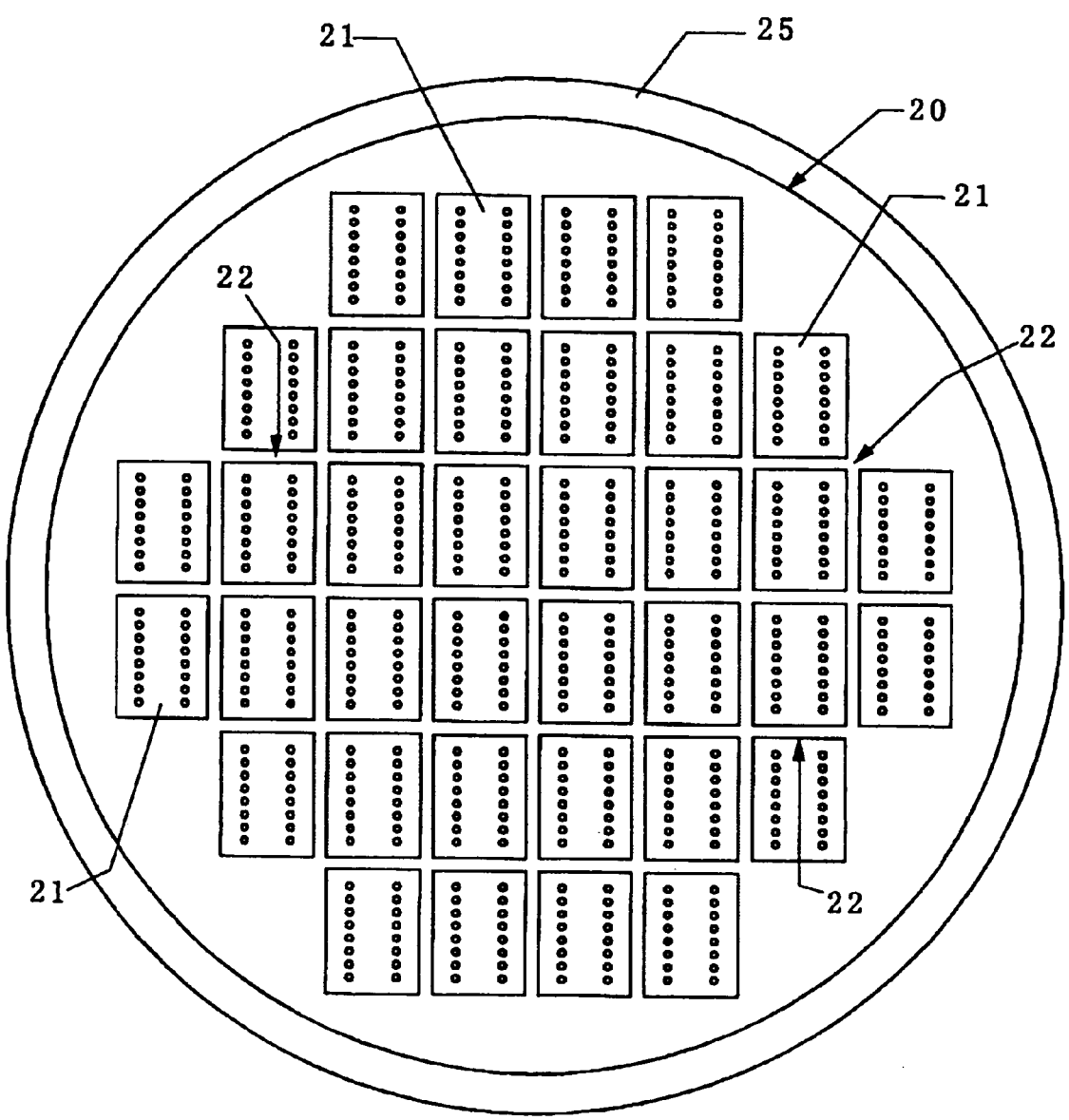
FIG. 12 is a schematic plan view for explaining the manufacture of the semiconductor device in the embodiment 1 of the present invention.

FIGS. 1 to 17b are views for explaining the semiconductor device in the embodiment 1 of the present invention, that is, FIG. 1 is a schematic view illustrating the configuration of the semiconductor device;

FIG. 2 is an enlarged schematic sectional view illustrating a part shown in FIG. 1;

FIG. 3a is a schematic sectional view illustrating an entire configuration of a semiconductor chip located at the lowermost stage in a chip lamination shown in FIG. 1:

FIG. 3b is an enlarged schematic sectional view illustrating a part in FIG. 3a;

FIG. 4a is a schematic sectional view illustrating an entire configuration of a semiconductor chip located at the uppermost stage in the chip lamination shown in FIG. 1;

FIG. 4b is an enlarged schematic sectional view illustrating a part in FIG. 4a;

FIG. 5 is a schematic sectional view illustrating a configuration of an interposer chip interposed between the lowermost stage semiconductor chip and the uppermost stage semiconductor chip in the chip lamination shown in FIG. 1;

FIG. 6a is a schematic enlarged sectional view illustrating configuration of a left side electrode as viewed in FIG. 5;

FIG. 6b is a schematic enlarged sectional view illustrating a configuration of a right side electrode as viewed in FIG. 5;

FIG. 7a is a plan view illustrating an electrode part as viewed from the principal surface side of the interposer chip;

FIG. 7b is a plan view illustrating the electrode part as viewed from the rear surface side of the interposer chip:

FIG. 8 is a schematic enlarged view illustrating the electrode part shown in FIG. 3b;

FIG. 9a is a schematic plan view illustrating a configuration of a concave electrode shown in FIG. 8;

FIG. 9b is a schematic sectional view illustrating the configuration of the concave electrode;

FIG. 10 is a schematic plan view illustrating a semiconductor wafer used for manufacturing the semiconductor device in the embodiment 1 of the present invention;

FIG. 11 is a schematic sectional view illustrating the semiconductor wafer shown in FIG. 10;

FIG. 12 is a schematic plan view for explaining the manufacture of the semiconductor device; and FIGS. 13a to 17b are sectional views for explaining the manufacture of the semiconductor device.

The semiconductor device in the embodiment 1 has a package configuration having a chip lamination 30 on a principal surface 36x of a wiring substrate (a mounting substrate or a package substrate) 36, as shown in FIG. 1. The chip lamination 30 has, for example, such a configuration that an interposer chip 11 is arranged between semiconductor chips 1a, 1b having different external sizes, which are three-dimensionally laminated one upon another although the invention should not be limited to this configuration. The interposer chip 11 is an intermediate wiring substrate incorporating conductor paths for electrically connecting a lower stage semiconductor chip 1a and an upper stage semiconductor chip 1b to each other. The semiconductor chip 1a is mounted on the principal surface 11x side of the interposer chip 11 while the semiconductor chip 1b is mounted on the rear surface 11y side of the interposer chip 11.

The wiring substrate 36 has a quadrangle in a plane crossing the thicknesswise direction thereof, and in this embodiment, it has, for example, a rectangular shape. The wiring substrate 36 is a resin substrate in which, for example, lath fibers is impregnated with epoxy or polyamide group resin, although the present invention should not be limited to this example, and a plurality of electrode pads 33 which are parts of a plurality of wirings are arranged, as connection parts, on the principal surface 36x while a plurality of electrode pads (lands) 34 which are parts of a plurality of wirings are arranged, as connection parts, on the rear surface 36y, on the side remote from the principal surface 36x. The electrode pads 33 on the principal surface 36x side, are electrically connected with the electrode pads 34 on the rear surface 36y side through the intermediary of through-hole wirings or the like formed in the wiring substrate 36. The respective electrode pads 34 are electrically and mechanically connected thereto with, for example, solder bumps 37 as external connection terminals (external electrodes).

The semiconductor chips 1a, 1b have a quadrangle in a plane crossing the thicknesswise direction thereof, although not precisely shown in the figures, and in this embodiment, it has, for example, a rectangular shape, as shown in FIGS. 3a to 4b. Each of the semiconductor chips 1a, 1b is composed, for example, of a semiconductor substrate 2, a plurality of transistor elements formed on the principal surface of the semiconductor substrate 2, a thin film lamination (multiple wiring layes) 3 in which insulation layers and wiring layers are laminated one upon another at several stages on the principal surface of the semiconductor substrate 2 although the present invention should not be limited to this configuration. As the semiconductor substrate 2, for example, a single crystal silicon substrate is used. As the insulation film layer in the thin film lamination 3, an oxide silicon film is use while the wiring layer is formed of a metal film made of, for example, aluminum (Al), aluminum alloy, copper (Cu) or copper alloy.

Each of the semiconductor chips 1a, 1b has the principal surface 1x (an element forming surface, a circuit forming surface or the like) and a rear surface 1y which are located on opposite sides of the chip, and an integrated circuit is mainly composed of the transistor elements formed on the principal surface 1x and wirings formed in the thin film lamination 3.

A plurality of electrode pads (bonding pads) 4 which are electrically connected to the integrated circuit are arranged on the principal surface 1x of each of the semiconductor chips 1a, 1b. In this embodiment 1, the plurality of electrode pads 4 are arranged along two sides (a first side 1x1 and a second side 1x2) of the principal surface 1x of the semiconductor chip (1a, 1b) which are located on opposite sides of the principal surface 1x. These electrode pads 4 are formed in the uppermost wiring layer in the thin film lamination 3 of the semiconductor chip (1a, 1b) and are exposed through bonding apertures formed in the upper insulation layer in the thin film lamination 3, which correspond to the electrode pads 4, respectively.

The plurality of electrode pads 4 of the semiconductor chip 1a include a plurality of electrode pads 4a, 4b (Refer to FIG. 3a), and the plurality of electrode pads 4 of the semiconductor chip 1b include a plurality of electrode pads 4c, 4d (Refer to FIGS. 4a and 4b).

The electrode pads 4 of the semiconductor chips 1a, 1b are electrically and mechanically connected thereto with stud bumps 9 made of, for example Au, which are protrusion electrodes projected from the principal surface 1x of the semiconductor chip (1a, 1b).

The semiconductor chip 1a has a plurality of concave electrodes 8 which are provided, corresponding to the plurality of electrode pads 4, as shown in FIGS. 3a and 3b. Each of the concave electrodes 8 has a recess 7 which is depressed from the rear surface 1y side of the semiconductor chip 1a toward the electrode pad 4, and is electrically and mechanically connected to the electrode pad 4. The concave electrode 8 is formed along an inner wall surface of a hole 5 which is extended from the rear surface 1y of the semiconductor chip 1a to the electrode pad 4 through the semiconductor substrate 2 and the thin film lamination 3. In this embodiment 1, the concave electrode 8 is led out at the rear surface 1y of, for example, the semiconductor chip 1a, and further covers the rear surface of the electrode pad 4.

As shown in FIG. 1, the external size of the semiconductor chip 1a is larger than that of the semiconductor chip 1b. The semiconductor chip 1a is incorporated therein with, for example, a logic circuit as the integrated circuit while the semiconductor chip 1b is incorporated therein with a memory circuit as the integrated circuit. The chip lamination 30 in the embodiment has a laminated structure in which the semiconductor chip 1a having a larger number of the electrode pads is arranged on the lower stage side but the semiconductor chip 1a having a smaller number of the electrode pads is arranged on the upper stage side.

As shown in FIG. 8, the concave electrode 8 (8a, 8b) is electrically insulated from the semiconductor substrate 2 by means of an insulation film (9a, 9b) formed on the rear surface 1y of the semiconductor chip 1a and an insulation film 9b formed along the inner wall surface of the hole 5. The concave electrode 8 is formed of, for example, a conductive film 6 having a multiple layer structure composed of a seed layer 6a and a plating layer 6b laminated in the mentioned order from the lower layer (the substrate side) although the present invention should not be limited to this configuration. The seed layer 6a is formed of a multilayer film (Ti/TiN) composed of, for example, a Ti film and a TiN film laminated in the mentioned order from the lower layer, and the plating layer 6b is formed of a multilayer film (Cu/Au) composed of, for example, a Cu film and an Au film laminated in the mentioned order from the lower layer.

The interposer chip 11 shown in FIG. 1 has a quadrangle in a plane crossing the thicknesswise direction thereof although it is not precisely shown, and, for example, it is rectangular in this embodiment. The interposer chip 11 is mainly composed of a semiconductor substrate 12 made of, for example, single crystal silicon as shown in FIG. 5 although the present invention should not be limited to this configuration.

The interposer chip 11 has a principal surface 11x and a rear surface 11y which are located respectively on opposite sides thereof, as shown in FIG. 5, a plurality of electrode pads 14 being provided on the principal surface 11x side. The plurality of electrode pads 14 include electrode pads 14a, 14b, 14c, 14d.

A plurality of electrode pads 14a are arranged along one side (a first side 11x1) of the interposer chip 11, corresponding to the plurality of the concave electrodes 8a (Refer to FIG. 2) arranged along the first side 1x1 of the semiconductor chip 1a. The plurality of electrode pads 14b are arranged along the other side (a second side 11x2) opposite to the side (the first side 11x1), corresponding to the plurality of concave electrodes 8b (Refer to FIG. 2) arranged along the second side 11x2 of the semiconductor chip 1a.

The plurality of electrode pads 14a and the plurality of electrode pads 14b are electrically and mechanically connected respectively thereto with stud bumps 9 made of, for example, Au as protrusion electrodes projected from the principal surface 11z of the interposer chip 11, similar to the semiconductor chip 1a as stated above. The stud bumps 9 are formed by, for example, a ball bonding (nail head bonding) process using Au wires. In the ball bonding process, the chip end of the Au wire is melted so as to form a ball part which is thereafter thermally fused to the electrode pad under the application of ultrasonic vibration, and then, the ball part is cut off from the Au wire. Thus, the stud bump 8 is obtained.

The plurality of electrode pads 14c are arranged along the first side 11x1 of the interposer chip 11, inside of the electrode pads 14a. The plurality of electrode pads 14d are arranged along the second side 11x2 of the interposer chip 11, in side of the electrode pads 14b.

The interposer chip 11 is formed therein with a plurality of concave electrodes 18, as shown in FIG. 5 to FIG. 6b. The plurality of concave electrodes 18 include a plurality of concave electrodes 18b, 18c, 18d.

The interposer chip 11 has a plurality of concave electrodes 18 as shown in FIGS. 6a and 6b, including a plurality of concave electrodes 18b, 18c, 18d.

The concave electrode 18c has a recess 17 which is depressed from the rear surface 11y side (the rear surface side of the semiconductor substrate 11a) of the interposer chip 11 to the electrode pad 14c, as shown in FIGS. 5 and 6a, and is electrically and mechanically connected to the electrode pad 14c. The concave electrode 18c is formed along the inner wall surface of a hole 15 extended from the rear surface 11y of the interposer chip 11 to the electrode pad 14c. In this embodiment 1, the concave electrode 18c is led out onto, for example, the rear surface 11y of the interposer chip 11 so as to cover the rear surface of the electrode pad 14c.

The concave electrode 18b has a recess 17 which is depressed from the rear surface 11y side of the interposer chip 11 to the electrode pad 14b, as shown in FIGS. 5 and 6b, and is electrically and mechanically connected to the electrode pad 14b. The concave electrode 18b is formed along the inner wall surface of a hole 15 extended from the rear surface 11y of the interposer chip 11 to the electrode pad 14b. In this embodiment 1, the concave electrode 18b is led out onto, for example, the rear surface 11y of the interposer chip 11 so as to cover the rear surface of the electrode pad 14b.

The concave electrode 18d has a recess 17 which is depressed from the rear surface 11y side of the interposer chip 11 to the electrode pad 14d, as shown in FIGS. 5 and 6b, and is electrically and mechanically connected to the electrode pad 14d. The concave electrode 18d is formed along the inner wall surface of a hole 15 extended from the rear surface 11y of the interposer chip 11 to the electrode pad 14d. In this embodiment 1, the concave electrode 18d is led out onto, for example, the rear surface 11y of the interposer chip so as to cover the rear surface of the electrode pad 14d.

As shown in FIG. 6a, the electrode pad 14a is electrically connected to the electrode pad 14c corresponding thereto, through the intermediary of a wiring 14n formed on the principal surface 11x of the interposer chip 11. As shown in FIG. 6b, the concave electrode 18b is electrically connected to the concave electrode 18d corresponding thereto through the intermediary of a wiring 18n formed on the rear surface 11y of the interposer chip 11. That is, the interposer chip 11 has the principal surface 11x and the rear surface 11y which are used as wiring layers and on which the wirings are formed.

The electrode pads 14a, 14c are integrally incorporated with the wiring 14n. In other words, they are parts of the wiring 14n. Further, the concave electrodes 18b, 18d are integrally incorporated with, for example, the wiring 18n. In other words, they are parts of the wiring 18n. In this embodiment 1, the electrode pads 14 (14a to 14d) and the wring 14n are formed, for example, by patterning a conductive film 13 formed on the principal surface 11x of the interposer chip 11, that is, they are formed from one and the same conductive film 13. Further, the concave electrodes 18 (18b to 18d) and the wiring 18n are formed, for example, by patterning a conductive film 16 formed on the rear surface 11y of the interposer chip 11, including the insides of the holes 15, that is, they are formed from one and the same conductive film 16.

Although not shown in detail, the conductive film 13 is electrically insulated and isolated from the semiconductor substrate 12 by an insulation film formed on the principal surface of the semiconductor substrate 12. The conductive film 16 is also electrically insulated and isolated from the semiconductor substrate 12 by an insulation film formed in the rear surface of the semiconductor substrate 12 and insulation films formed along the inner wall surfaces of the holes 15. The conductive film 13 is made of a material similar to, for example, that of the electrode pads 4 on the semiconductor chip 1a. The conductive film 16 is made of a material similar to, for example, that of the concave electrodes 8 of the semiconductor chip 1a.

As shown in FIGS. 7a and 7b, the wiring 18n (a wiring part (connection part) between the concave electrodes 18b, 18d in such a case that the concave electrodes 18b, 18d are regarded as parts of the wiring) is thicker (wider) than the wiring 14n (a wiring part (connection part) between the electrode pads 14a, 14c in such a case that the electrode pads 14a, 14c are regarded as parts of the wiring).

It is noted that the electrode structure including the electrode pads 4 and the concave electrodes 8 which are connected to the former and the electrode structure including the electrode pads 14 and the concave electrodes 18 connected to the former will be referred to "piercing electrodes" in the present invention.

As shown in FIG. 1, the stud bump 9 attached (connected) to the electrode pad 14a in the interposer chip 11 has a part which is press-fitted in the recess (in the recess of the piercing electrode) 7 of the concave electrode 8a of the semiconductor chip 1a located at the lower stage, and the stud bump 9 attached to the electrode pad 14b of the interposer chip 11 has a part which is press-fitted in the recess 7 (in the recess of a piercing electrode) of the concave electrode 8b in the semiconductor chip 1a arranged at the lower stage, through deformation caused by plastic flow. The electrode pads (14a, 14b) of the interposer chip 11 are electrically connected to the electrode pads (4a, 4b) of the semiconductor chip 1a at the lower stage, respectively.

As shown in FIG. 1, the stud bump 9 attached (connected) to the electrode pad 4c of the semiconductor chip 1b located at the upper stage has a part which is press-fitted in a recess 17 (in a recess of a piercing electrode) of the concave electrode 18c of the interposer chip 11, and the stud bump 9 attached (connected) to the electrode pad 4d of the semiconductor chip located at the upper stage is press-fitted in the recess 7 of the concave electrode 18d in the interposer chip 11, through deformation caused by plastic flow. The electrode pads (4c, 4d) of the upper stage semiconductor chip 1b are electrically connected to the electrode pads (14c, 14d) of the interposer chip 11, respectively.

That is, the electrode pad 4a of the lower stage semiconductor chip 1a and the electrode pad 4c of the upper stage semiconductor chip 1b are electrically connected to each other by way of a first conductive path including the concave electrode 8a, the stud bump 9, the electrode pad 14a, the wiring 14n, the electrode pad 14c, the concave electrode 18c and the stud bump 9 as arranged in the mentioned order from the electrode pad 4a side of the semiconductor chip 1a. Further, the electrode pad 4b of the lower stage semiconductor chip 1a and the electrode pad 4d of the upper stage semiconductor chip 1b are electrically connected to each other by way of a second conductive path including the concave electrode 8b, the stud bump 9, the electrode pad 14b, the concave electrode 18b, the wiring 18n, the concave electrode 18d and the stud bump 9 as arranged in the mentioned order from the electrode pad 4b side of the lower stage semiconductor chip 1a.

In this embodiment 1, the recess 7 of the concave electrode 8 (8a, 8b) of the lower stage semiconductor electrode 1a is filled therein with the stud bump 9 of the interposer chip 11, as shown in FIGS. 1 and 2. Further, the recess 17 of the concave electrode 18 (18c, 18d) of the interposer chip 11 is also filled therein with the stud bump 9 of the upper stage semiconductor chip 1b.

Press-fitting of the stud bump 9 into the concave electrode of the interposer chip 11 through deformation caused by plastic flow is effected, for example, by pressing the semiconductor chip 1b against the rear surface 11y of the interposer chip 11. Press-fitting of the stud bump 9 into the concave electrode of the semiconductor chip 1a through deformation caused by plastic flow is effected, for example, by pressing the semiconductor chip 1a against the principal surface 11x of the interposer chip 11.

Thus, the upper and lower different semiconductor chips (1a, 1b) are electrically connected to each other by way or the rewiring layers (the conductive films 13, 16). For example, the rewiring layer (the conductive film 13) a1 on the principal surface 11x side of the interposer chip 11 is used for connection between signal pins of the upper and lower semiconductor chips (1a, 1b), and the rewiring layer (the conductive film 16) a2 formed on the rear surface 11y side of the interposer chip 11 is used for connection between a power source pin and a ground pin which are commonly used by the upper stage semiconductor chip 1b and the lower stage semiconductor chip 1a. Specifically, by forming a power source-ground plane layer which is commonly used by the upper and lower stage semiconductor chips, on the rear surface 11y side of the interposer chip 11, the upper and lower stage semiconductor chips (1a, 1b) are connected from the power source-ground plane layer formed on the rear surface 11y side of the interposer chip 11, substantially equivalent to each other, by a shortest wiring length.

The interposer chip 11 is electrically connected to the piercing electrode part (concave electrode 8b) formed at the power source-ground position of the lower stage semiconductor chip 1a by the above-mentioned connecting method, and the piercing electrode part (concave electrode 18b) electrically connected to the rear surface side is formed right above the electrode position of the interposed chip 11 which has been thus connected. The piercing electrode part (concave electrode 18b) and the electrode at the power source-ground position of the upper stage semiconductor chip 1b are rewired to each other on the rear surface 11y side of the interposer chip 11. At this stage, the stud bump 9 formed at the power source-ground electrode position of the upper stage semiconductor chip 1b is electrically connected to the piercing electrode part (concave electrode 18d) formed on the rear surface 11y side of the interposer chip 11 at the same position on the rear surface 11y of the interposer chip 11 by a method similar to that stated above.

Between the power source pins and between the ground pins, which are commonly used by the upper and lower stage semiconductor chips (1a, 1b) are rewired on the rear surface 11y side of the interposer chip 11 with a thick wiring pattern or a plane layer having a certain range so as to prevent occurrence of potential difference between the pin as far as possible.

Thus, noise in the power source system can be restrained to a minimum, and accordingly, there may be provided a structure which is extremely advantageous for high speed transmission. Further, in such a case that no power source pins commonly used by the upper and lower stage semiconductor chips (1a, 1b) are present, the lower stage semiconductor chip 1a has to be an exclusive chip formed thereon with dummy electrodes at several positions for inputting an operating voltage of the upper stage semiconductor chip 1b.

As shown in FIGS. 1 and 2, the lowermost stage semiconductor chip 1a has its principal surface (circuit surface) 1x facing the principal surface 36x of the wiring substrate 36, and is adhered and fixed to the principal surface 36x of the wiring substrate 36 through the intermediary of an adhesive 26c between the principal surface 1x and the principal surface 36x. The stud bump 9 of the lowermost stage semiconductor chip 1a is made into press contact with an electrode pad 33 of the wiring substrate 36 by a thermal shrinkage force (a shrinkage force effected when the temperature is lowered from a heating condition to the room temperature condition) of the adhesive 26c, a thermo-curing shrinkage force (a shrinkage force caused upon curing of thermosetting type insulation resin) or the like, so as to be electrically connected to the electrode pad 33. However, any connection method other than this connection method may be used, that is, for example, the stud bump 9 is connected to the electrode pad 33 through the intermediary of solder, or they are electrically joined to each other through metal joint by applying ultrasonic waves.

As shown in FIG. 1, resin 26a is filled between the interposer chip 11 and the semiconductor chip 1b so as to seal the principal surface 1x of the semiconductor chip 1b and to adhere and fix the semiconductor chip 1b to the interposer chip 11. Further, resin 26b is filled between the interposer chip 11 and the semiconductor chip 1a so as to seal the rear surface of the semiconductor chip 1a and to adhere and fix the semiconductor chip 1a to the interposer chip 11. As the resin 26a and the resin 26b, phenol group setting agent, silicone rubber or epoxy group thermosetting resin added therein with filler or the like is used in order to obtain lower stressedness.

The filling of the resin 26a, 26b may be made, for example, by a resin film or liquid resin which is previously set on a press-fixing surface (the rear surface 11y in the case of the semiconductor chip 1b, but the principal surface 11x in the case of the semiconductor chip 1a) of the interposer chip 11 before the semiconductor chips 1a, 1b are press-fixed to each other.

The resin 26a is also provided around the semiconductor chip 1b as shown in FIG. 1. The resin 26a around the semiconductor chip 1b is formed by a thickness substantially equal to a distance from the rear surface 11y of the interposer chip 11 to the rear surface 1y of the semiconductor chip 1a. This resin 26a around the semiconductor chip 1b serves as a support (foundation) when the a stud bump 9 is formed on the electrode pad 14 (14a, 14b) of the interposer chip 11 (Refer to FIG. 14b), when the stud bump 9 on the electrode pad 14 (14a, 14b) of the interposer chip 11 is press-fitted into the recess 7 of the concave electrode 8 of the semiconductor chip 1a through deformation caused by plastic flow (Refer to FIG. 15a) or when the stud bump 9 is formed on the electrode pad 4 (4a, 4b) of the semiconductor chip 1a (Refer to FIG. 15b).

As stated above, the lowermost stage semiconductor chip 1a and the uppermost stage semiconductor chip 1b which are different kinds of, may be three-dimensionally connected so as to effect electric operation through the intermediary of the interposer chip 11 with shortest wiring lengths. It goes without saying that the interposer chip can have not only a wiring pattern for rewiring but also a wiring pattern for high speed transmission of signals, by a wiring design with which capacitors are formed so as to effect impedance matching. For example, in such a case that the lowermost stage semiconductor chip 1a is a high performance microcomputer (MPU: Micro Processing Unit) having a high frequency performance in a Giga Hz range while the uppermost stage semiconductor chip 1b is a high speed memory (DRAM: Dynamic Random Access Memory), a high speed bus transmission design between the MPU and the DRAM can be made on the intermediate interposer chip 11 with a high density and shortest wiring lengths, and accordingly, a high performance system may be built up, being substituted for a system LSI mixed with a mass storage memory and made by an SOC (System On Chip) process. Since a premise of long distance connection between chips as during mounting of an usual board is considered, although the signal drive performance is enhanced at the sacrifice of a high speed and a lower voltage of input/output circuits of the respective chips, the drive performance of the input/output circuits may be set to a value as low as the SOS by materializing the interchip connection having a shortest wiring length as stated above. Thereby it is possible to accelerate the high speed transmission of a device and to reduce power consumption.

As shown in FIG. 8, the concave electrode 8 (8a, 8b) of the semiconductor chip 1a is electrically insulated from the semiconductor chip 1a by the insulation film (9a, 9b) formed on the rear surface 1y of the semiconductor chip 1a and the insulation film 9b formed along the inner wall surface of the hole 5. This concave electrode 8 is formed in such a way that a hole 5 having a depth extended from the rear surface of the semiconductor wafer to the electrode pad 4 on the principal side thereof is formed in a semiconductor wafer by dry etching or the like before the semiconductor wafer is cut into pieces in order to form semiconductor chips, and thereafter, the conductive film 6 is formed on the rear surface of the semiconductor wafer including the inside of the hole 5 and is then patterned. Thus, when the hole 5 is formed on the rear surface of the water by dry etching, it is preferable to form the hole 5 in such a way that the side wall surface of the hole 5 is outwardly inclined to the vertical normal line at an angle of 0 to 5 deg. That is, the hole 5 is formed so that the bore diameter is set to be equal or increased (become wider) inward of the hole. According, the concave electrode 8 has a bore diameter of the recess 7 which is uniform or increased inward of the hole 5, and therefore, the stud bump 9 formed on the electrode pad 4 is fitted into the recess 7 of the concave electrode 8 through deformation caused by plastic flow during pressing, thereby it is possible to materialize a connecting structure in a geometrical calking condition. An edge part 5a at the inlet of the hole on the rear surface side is preferably chamfered so as to be rounded without forming a right angle edge in order to continuously and uniformly coat a processing resist film thereover during an etching step for a plating film. In the section of the inner wall of the hole, the insulation film 9b is formed at a silicon processed surface, the seed layer 6a and the plating layer 6b formed by electric plating are formed thereon although the invention should not be limited to this configuration. Contact zones of the concave electrode (piercing electrode) 8 and the electrode pad (device side electrode part) 4 are electrically connected to each other through the intermediary of the seed layer (Ti/Cu, Cr) 6a in view of ensuring adherence. Further, the rear surface side of the wafer is protected by another insulation film as necessary.

As shown in FIG. 9, the hole 5 is formed in a circular shape corresponding to the shape of the stud bump 9, and a circular plating electrode (concave electrode 8) is formed on the rear surface 1y side of the semiconductor chip 1a having a shape corresponding to the shape of the stud bump 9.

Although not shown in detail, explanation will be made with reference to FIGS. 6a and 6b, the concave electrode 18 (18b, 18c, 18d) of the interposer chip 11 is electrically insulated from the semiconductor substrate 2 by the insulator film formed on the rear surface 11y of the interposer chip 11 and the insulation film formed along the inner wall surface of the hole 15. This concave electrode 18 is formed, similar to the concave electrode 8 of the semiconductor chip 1a, in such a way that the a semiconductor wafer is formed therein with the hole 15 by a depth extending from the rear surface of the semiconductor wafer to an electrode pad on the principal surface thereof, by dry etching before the semiconductor wafer is cut into pieces from which a plurality of interposer chips 11 are formed, then, the conductive film 16 is formed over the rear surface of the semiconductor wafer including the inside of the hole 15, and thereafter, the conducive film 16 is patterned. Accordingly, similar to the concave electrode 8 in the semiconductor chip 1a, the concave electrode 18 is desirably formed such that the side wall surface of the hole 15 is inclined outward at an angle of 0 to 5 deg., to the vertical normal line (Refer to FIG. 8). Accordingly, the stud bump 9 formed on the electrode pad is fitted in the recess of the concave electrode through deformation caused by plastic flow during press fitting. Thus, a connecting structure in which a geometrical caking condition is obtained may be materialized. Further, referring to FIG. 8, similar to the hole 5 in the semiconductor chip 1a, the rear surface side edge part (15a) of the inlet of the hole 15 in the interposer chip 11 is desirably rounded or chamfered so as to eliminate a right angle edge part, and accordingly, a processing resist film may be continuously and uniformly coated during an etching step for a plating film. In the section of the inner wall of the hole, an insulation film is formed on a silicon processed surface, and the seed layer (16a) and the plating layer (16b) formed by electrolytic plating are formed thereon, although the present invention should not be limited to this configuration. Contact zones of the concave electrode (piercing electrode) 18 and the electrode pad (device side electrode part) 14 are electrically connected to each other through the intermediary of the seed layer (6a) in view of ensuring adherence, similar to the semiconductor chip 1a. Further, the rear surface side of the wafer is protected with another insulation film.

The hole 15 in the interposer chip 11 is also formed in a circular shape corresponding to the shape of the stud bump 9, and a circular plating electrode (concave electrode 18) is formed on the rear surface 11y side of the interposer chip so as to have a shape corresponding the stud bump 9.

Figure 25:
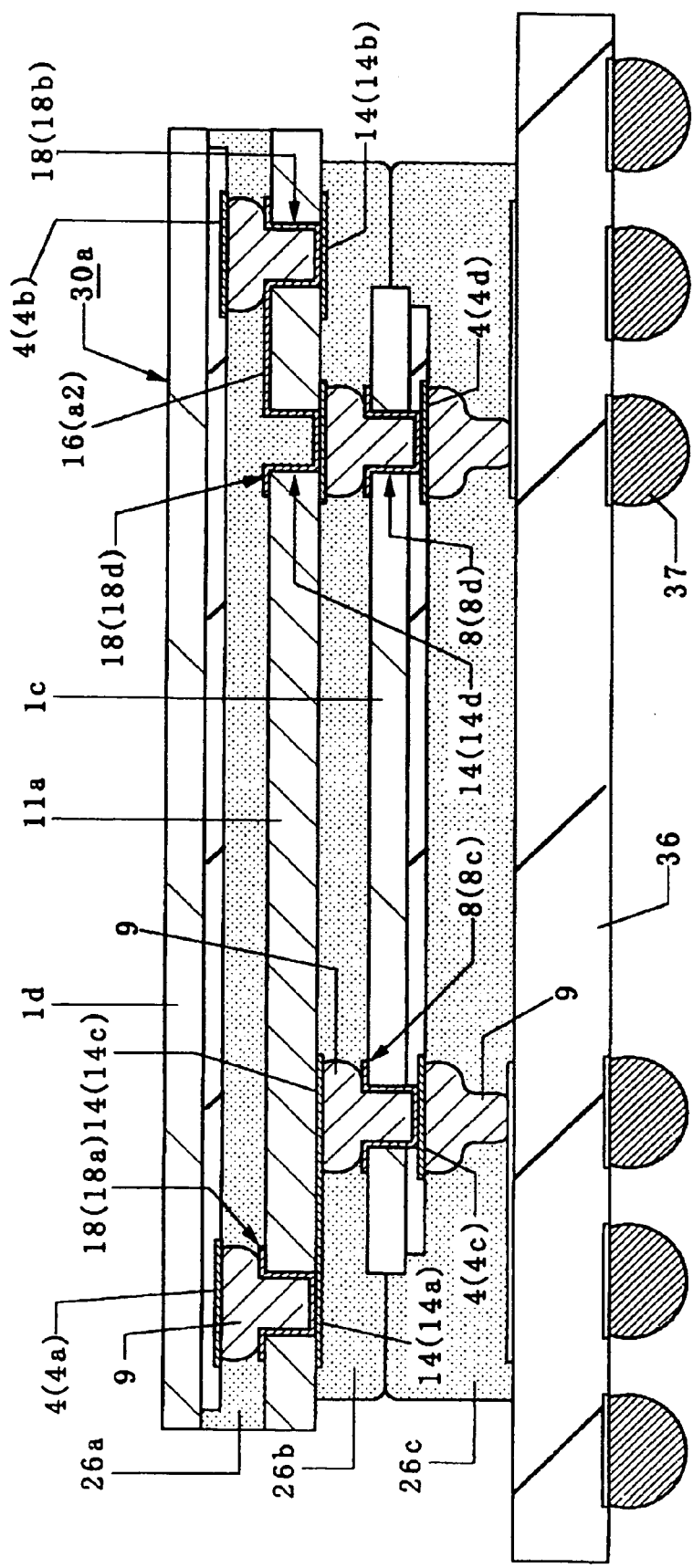
FIG. 25 is a schematic sectional view illustrating a semiconductor device in an embodiment 2 of the present invention.

The chip configuration of the upper and lower stage different semiconductor chips (1a, 1b) is such that the semiconductor chip 1a having a larger number of pins are basically laid at the lower stage while the semiconductor chip 1b having a smaller number of pins is laid at the upper stage, the interposer chip 11 being interposed therebetween. As to the sizes of the chips, although the upper stage semiconductor chip is smaller than the lower stage semiconductor chip as shown in FIG. 1, the upper stage chip may be larger than the lower stage chip as shown in FIG. 25. In this case, the joint position (stud bump 9) of the upper stage semiconductor chip 1a is arranged outside of the lower stage semiconductor chip 1b. Thus, in such a lamination that chips are one upon another from the lower stage to the upper stage as in a conventional one, if an upper stage semiconductor chip having a chip having a smaller size, since no foundation for receiving a load upon joint is present at the bump joint position, and further, since individual chips to be laminated have an ultra thin thickness of 5 to 50 μm, a pressing load may not possibly transmitted to the joint part.

In view of the above-mentioned problem during assembly, explanation will be made of the assembly of the semiconductor device in the embodiment 1 (FIG. 1) with reference to FIG. 10 to 17b.

At first, semiconductor chips (1a, 1b) as shown in FIGS. 3a to 4b, and a semiconductor wafer 20 shown in FIGS. 10 and 11 are prepared. In the configuration of the embodiment 1, the stud bumps 9 have been previously formed in the semiconductor chip 1b, but no stud bumps have yet been formed in the semiconductor chip 1a.

The semiconductor wafer 20 is mainly formed of the semiconductor substrate (12) made of single crystal silicon, and is arranged thereon an array of product forming zones 21 which are plotted by dicing zones (separating zones), and each of which has a structure and a planar shape basically similar to those of the interposer chip 11 as shown in FIG. 5. The interposer chip 11 shown in FIG. 5, is formed by dicing the plurality of product forming zones 21 of the semiconductor wafer 20 into individual pieces. Thus, each product forming zone 21 has a wiring pattern (conductive film 13) including electrode pads 14 (14a, 14b, 14c, 14d) and wiring 14n on the principal surface 20x side of the semiconductor wafer 20, and a wiring pattern (conductive film 16) including concave electrodes 18 (18b, 18c, 18d) and wiring 18n on the rear surface 20y side, remote from the principal surface side 20x, of the semiconductor wafer 20. The semiconductor wafer 20 has a thin thickness having, for example, about 25 to 50 μm.

Next, as shown in FIGS. 12 and 13a, the semiconductor wafer 20 is adhered and fixed to a glass substrate 25 through the intermediary of an adhesive 25, the principal surface 20x (on which the electrode pads 14 are formed) of the semiconductor wafer 20 facing the glass substrate 25.

Next, as shown in FIG. 13b, the semiconductor chip 1b is mounted on the rear surface 20y side (on the surface side formed therein with the concave electrode 18) of the semiconductor wafer 20 in each of the product forming zone 21 of the semiconductor wafer 20. The stud bump 9 has been previously formed on each of the electrode pads 14 (14c, 14d) of the semiconductor chip 1b. During mounting of the semiconductor chip 1b, the semiconductor chip 1b is positioned so that the stud bumps 9 of the semiconductor chip 1b are set respectively on the concave electrodes 18 (18c, 18d) of the product forming zone 21, and thereafter, the semiconductor chip 1b is pressed against the product forming zone 21.

At this step, the stud bump 9 of the semiconductor chip 1b is press-fitted in part into the recess 7 of the concave electrode 18 (18c, 18d) in the product forming zone 21 (inter poser chip) through deformation caused by plastic flow, and is therefore electrically and mechanically connected to the concave electrode 18.

During this step, as shown in FIG. 13b, the principal surface of the semiconductor chip 1b is sealed between the product forming zone 21 and the semiconductor chip 1b, and the resin 26a is filled therebetween for adhering and fixing the semiconductor chip 1b to the product forming zone 21. The filling of the resin 26a is made in such a way that a resin film or liquid resin has been previously set on the product forming zone 21 before the semiconductor chip 1b is pressed against the product forming zone 21. As the resin 26a, in order to aim at lowering stress, for example, there may be used phenol group curing agent, silicone rubber, or epoxy group thermosetting resin added thereto with filler. In this case, the semiconductor chip 1b is pressed while the resin 26a is heated.

It is noted here that the resin 26a is interposed between the product forming zone 21 and the semiconductor chip 1b in this embodiment, and further, is also provided around the semiconductor chip 1b. The resin 26a around the semiconductor chip 1b serves as a support (foundation) as will be detailed later, when the stub bump 9 is formed on the electrode pad 14 (14a, 14b) of the product forming zone 21 (Refer to FIG. 14b), when the stud bump 9 is press-fitted in the recess 7 of the concave electrode 8 of the semiconductor chip 1b through deformation caused by plastic flow (Refer to FIG. 15a), or when the stud bump 9 is formed on the electrode pad 14 (4a, 14b) of the semiconductor chip 1a (Refer to FIG. 15b). Accordingly, the resin 26a around the semiconductor chip 1b has a thickness substantially equal to a distance from the product forming zone 21 (the rear surface 11y of the interposer chip 11) to the rear surface 1y of the semiconductor chip 1b.

Next, as shown in FIG. 14a, a dicing tape 27 is applied to the rear surface 1y of each of the semiconductor chips 1b respectively mounted on the product forming zones 21 of the semiconductor wafer 20. The dicing tape 27 has an adhesive layer (sticky layer) 27a on the surface side facing the rear surface 1y of the semiconductor chip 1b, and accordingly, the rear surface 1y of the semiconductor chip 1b is adhered and fixed to the dicing tape 27.

Next, in such a condition that the dicing tape 27 is applied, a process in which the semiconductor wafer 20 is peeled off from the glass plate 25 is carried out. This process is different, depending upon a kind of the adhesive 25a for adhering and fixing the semiconductor wafer 20. In the case of an adhesive of UV-curing type with the application of UV radiation or in the case of an adhesive of such a type that its bonding strength is lowered by heating, by a heating process or a laser application heating process, the semiconductor wafer 20 can be peeled off from the glass substrate 25.

Next, in a condition in which the dicing tape 27 is applied to the rear surface 1y of each semiconductor chip 1b, as shown in FIG. 14b, the stud bump 9 is formed on each electrode pad 14 (14a, 14b) in the product forming zone 21. The stud bump 9 is formed by, for example, a ball bonding process. The formation of the stud bump 9 is carried out in such a condition that the semiconductor wafer 20 is adhered to a bonding stage (a treatment bed) through the intermediary of the dicing tape 27 although it is not shown.

At this step, the resin 26a around the semiconductor chip 1b is filled between a part underneath the electrode pad 14 (14a, 14b) of the product forming zone) 21 and the dicing tape 27, and the part in the electrode pad 14 (14a, 14b) of the product forming part is supported to the bonding stage through the intermediary of the resin 26a and the dicing tape 27, and accordingly, a pressing load or ultrasonic vibration for forming the stud bump 9 can be surely transmitted to the electrode pad 14 (14a, 14b) even though the electrode pad 14 (14a, 14b) of the product forming zone 21 is located outside of the semiconductor chip 1b, thereby it is possible to surely join the electrode pad 14 (14a, 14b) to the stud bump 9.

It is noted that, even in the case of direct adhesion of the semiconductor wafer 20 to the bonding stage without the dicing tape 27 therebetween, the part in the electrode pad 14 (14a, 14b) of the product forming zone 21 is supported to the bonding stage through the intermediary of the resin 26a, and accordingly, the pads 14 (14a, 14b) may be simultaneously joined to the stud bumps 9.

It is noted here that the semiconductor wafer 20 has a thin thickness of, for example, about 25 to 25 μm so as to have a low mechanical strength, and accordingly, it is required to manufacture semiconductor devices in such a condition that the semiconductor wafer 20 is adhered to the glass substrate 25. Should the stud bump 9 have been previously formed on the electrode pad 14 (14a, 14b) of each product forming zone 21 on the semiconductor wafer 20, it would be difficult to apply the semiconductor wafer 20 onto the glass substrate 25. On the contrary, in this embodiment, after the semiconductor chip 1b is mounted on each product forming zone 21 of the semiconductor wafer 20, the stud 9 is formed on the electrode pad 14 (14a, 14b) of each product forming zone 21, and accordingly, as shown in FIG. 13b, the semiconductor chip 1b can be mounted on each product forming zone 2 in a condition in which the semiconductor wafer 20 is applied on the glass substrate 25.

Next, with such a condition that the dicing tape 7 is applied to the rear surface 1y of each semiconductor chip 1b, in the product forming zone 21 of the semiconductor wafer 20, the semiconductor chip 1*a* is mounted on the principal surface 20*x* side (on the surface side where the electrode pads 14 are formed), of the semiconductor wafer 20, as shown in FIG. 15*a*. In detail, the semiconductor chip 1*a* is position on the product forming zone 21 so that the concave electrodes 8 (8*a*, 8*b*) of the semiconductor chip 1*a*' are located on the stud bumps 9 formed on the electrode pads 14 (14*a*, 14*b*), and thereafter, the semiconductor chip 1*a* is pressed against the product forming zone 21. The semiconductor chip 1*a* is mounted in such a condition that the semiconductor wafer 20 is set on the bonding stage (treatment bed) through the intermediary of the dicing tape 27.

At this step, each of the stud bumps 9 of the product forming zone 21 (interposer chip 11) is in part press-fitted into the recess 7 of the concave electrode 8 (8*a*, 8*b*) through deformation caused by plastic flow, and accordingly, is electrically connected to the concave electrode 8 (8*a*, 8*b*).

Further, at this step, as shown in FIG. 15*a*, the rear surface 1*y* of the semiconductor chip 1*a* is sealed between the product forming zone 21 and the interposer chip 11, and further, resin 26*a* is filled therebetween so that the semiconductor chip 1*a* is adhered and fixed to the product forming zone 21. In detail, a resin film or liquid resin is previously laid on the product forming zone 21 before the semiconductor chip 1*a* is pressed thereagainst. As the resin 26*b*, there may be used those materials the same as the above-mentioned resin 26*a*.

Moreover at this step, the resin 26*a* around the semiconductor chip 1*b* is filled between the part in the electrode pad 14 (14*a*, 14*b*) of the product forming zone 21, and accordingly, the part in the electrode pad 14 (14*a*, 14*b*) of the product forming zone 21 is supported on the dicing tape 27 through the intermediary of the resin 26*a*. In other words, the foundation is formed from the resin 26*a* underneath the connection part (electrode pad 14*a*, 14*b*), and accordingly, even in such a case that the electrode pad 14 (14*a*, 14*b*) of the product forming zone 21 is located outside of the semiconductor chip 1*b* (the external shape of the semiconductor chip 1*a* is larger than that of the semiconductor chip 1*b* which has already been mounted), the bump 9 may be press-fitted into the recess 7 of the concave electrode 8 (8*a*, 8*b*) of the semiconductor chip 1*a* through deformation caused by plastic flow without any damage, thereby it is possible to surely mount the semiconductor chip 1*a* by pressing.

It is noted that even in such a case that the semiconductor wafer 20 is directly adhered to the bonding state with no dicing tape 27 being interposed therebetween, the part in the electrode pad 14 (14*a*, 14*b*) of the product forming zone 21 is supported on the bonding stage through the intermediary of the resin 26*a*, the semiconductor chip 1*a* can be surely mounted by pressing.

Next, in a condition in which the dicing tape 27 is applied on the rear surface 1*y* of each of the semiconductor chips 1*b* while the semiconductor chips 1*a*, 1*b* are mounted on each of the product forming zones 21 of the semiconductor wafer 20, as shown in FIG. 15*b*, the stud bump 9 is formed on the electrode pad 4 (4*a*, 4*b*) of each semiconductor chip 1*a*. The stud bump 9 is formed by, for example, a ball bonding process. That is, the stud bump 9 is formed in such a condition that the semiconductor wafer 20 is mounted on the bonding stage (treatment stage) through the intermediary of the dicing tape 27 although it is not shown.

At the above-mentioned step, the stud bump 9 formed on the electrode pad 14 (14*a*, 14*b*) of the product forming zone 21 is press-fitted in the recess 7 of the concave electrode 8 (8*a*, 8*b*) which are planarly overlapped with the electrode pad 4 (4*a*, 4*b*) of the semiconductor chip 1*a*, and further, the resin 26*a* around the semiconductor chip 1*b* is filled between the part underneath the electrode pad 14 (14*a*, 14*b*) of the product forming zone 21 and the dicing tape 27 while the part in the electrode pad 14 (14*a*, 14*b*) of the product forming zone 21 is supported to the dicing tape 27 through the intermediary of the resin 26*a* (in such a case that the foundation given by the resin 26*a* underneath the connection part (the electrode pads 14*a*, 14*b*) is formed). Thus, pressing load or ultrasonic vibration may be surely transmitted to the electrode pad 4 (4*a*, 4*b*) during forming the stud bump 9 even though the electrode pad 4 (4*a*, 4*b*) of the semiconductor chip 1*a* is located outside of the semiconductor chip 1*b* (the external shape of the semiconductor chip 1*a* which has been previously mounted is greater than that of the semiconductor chip 1*b* to be mounted), thereby it is possible to surely join the electrode pad 4 (4*a*, 4*b*) to the stud bump 9.

It is noted that even in such a case that the semiconductor wafer 20 is directly mounted on the bonding stage with no dicing tape being interposed therebetween, the part in the electrode pad 14 (14*a*, 14*b*) of the product forming zone 21 is supported onto the bonding stage through the intermediary of the resin 26*a*, and accordingly, the electrode pad 4 (4*a*, 4*b*) and the stud bump 9 are also surely joined to each other.

It is noted here that the semiconductor chip is mounted in such a way that the semiconductor chip 1*a* is sucked to a vacuum collet, then, the semiconductor chip 1*a* is carried by the vacuum collet to a position above the product forming zone 21, and thereafter, the semiconductor chip 1*a* is pressed against the product forming zone 21 by the vacuum collet, or in such a way that the semiconductor chip 1*a* is carried by the vacuum collet to a position above the product forming zone 21, and thereafter the semiconductor chip 1*a* is pressed at its rear surface 1*y* against the product forming zone 21 by a bonding tool. In even in either manner, should the stud bump 9 have been previously formed on the electrode pad 4 (4*a*, 4*b*), and the mounting of the semiconductor chip 1*a* by pressing would become difficult. On the contrary, in this embodiment 1, after the semiconductor chip 1*a* is mounted on the product forming zone of the semiconductor wafer 20, the stud bump is formed on the electrode pad 4 (4*a*, 4*b*) of the semiconductor chip 1*a*, and accordingly, the semiconductor chip 1*a* may be simply mounted on each of the product forming zones 21.

Figure 16A:
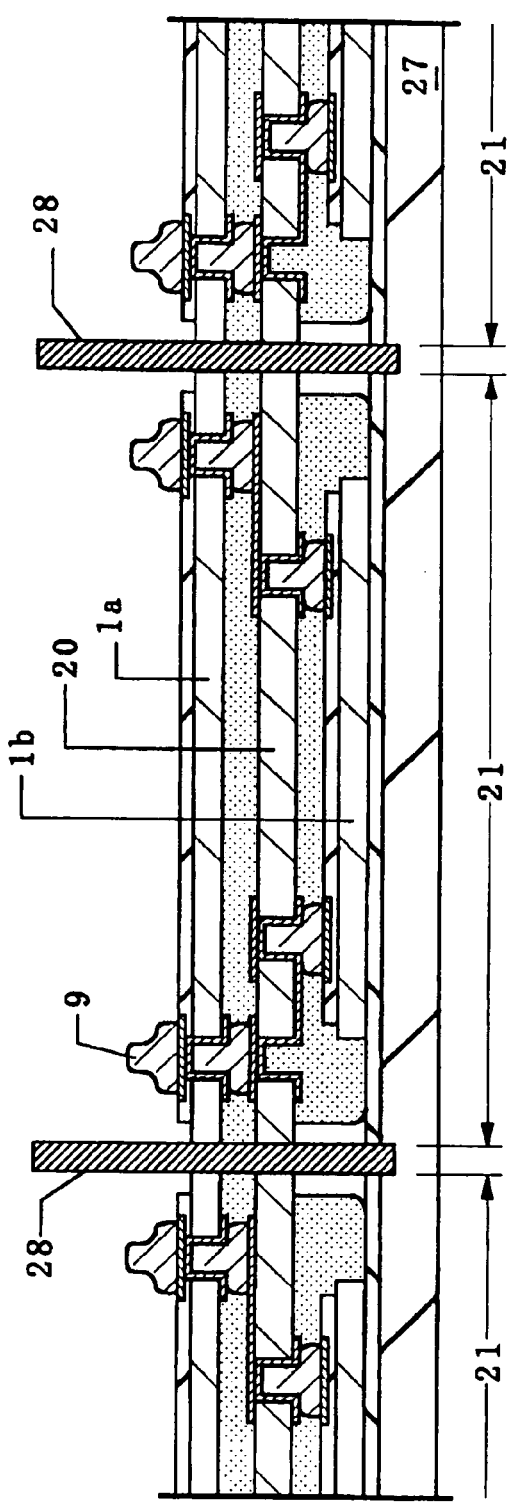
FIG. 16a is a schematic sectional view for explaining the manufacture of the semiconductor device in the embodiment 1 of the present invention.
Figure 16B:
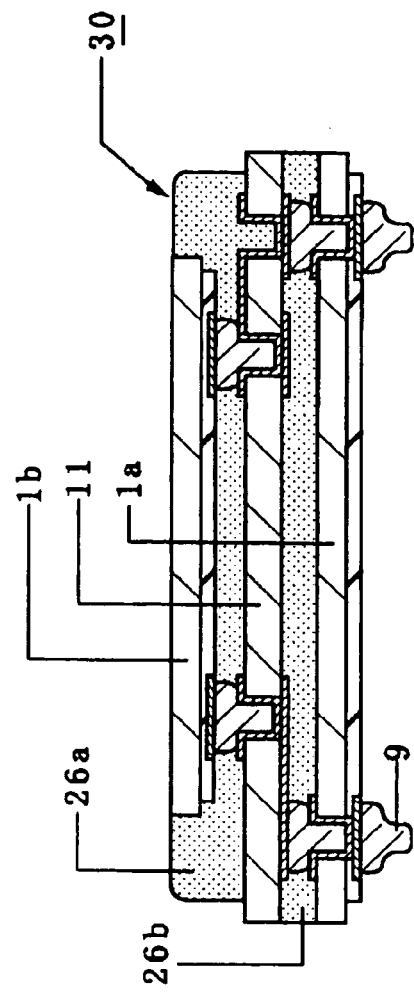
FIG. 16b is a schematic sectional view for explaining the manufacture of the semiconductor device in the embodiment 1 of the present invention.

Next, as shown in FIG. 16*a*, for example, with the use of a dicing blade 28, the semiconductor wafer 20 is diced along the dicing zone 22 into a plurality of product forming zones 21 separated from one another. Thus, the interposer chip 11 formed of the product forming zone 21 is obtained, and further, as shown in FIG. 16*b*, a chip lamination 30 in which the semiconductor chips (1*a*, 1*b*) having different external shapes are three-dimensionally laminated one upon another with the interposer chip 11 being interposed therebetween is formed.

Figure 17A:
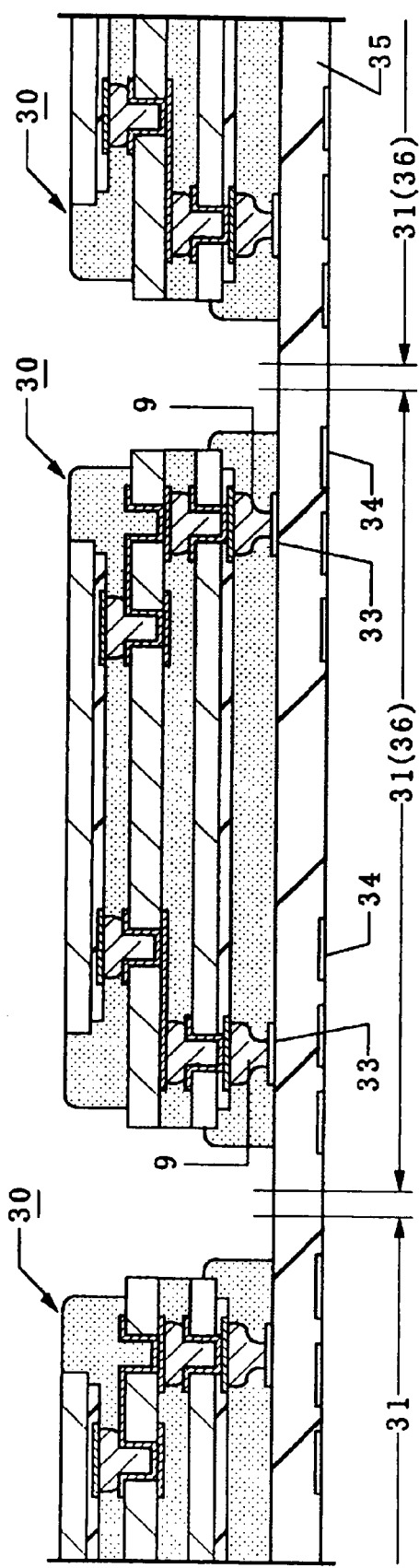
FIG. 17a is a schematic sectional view for explaining the manufacture of the semiconductor device in the embodiment 1 of the present invention.
Figure 17B:
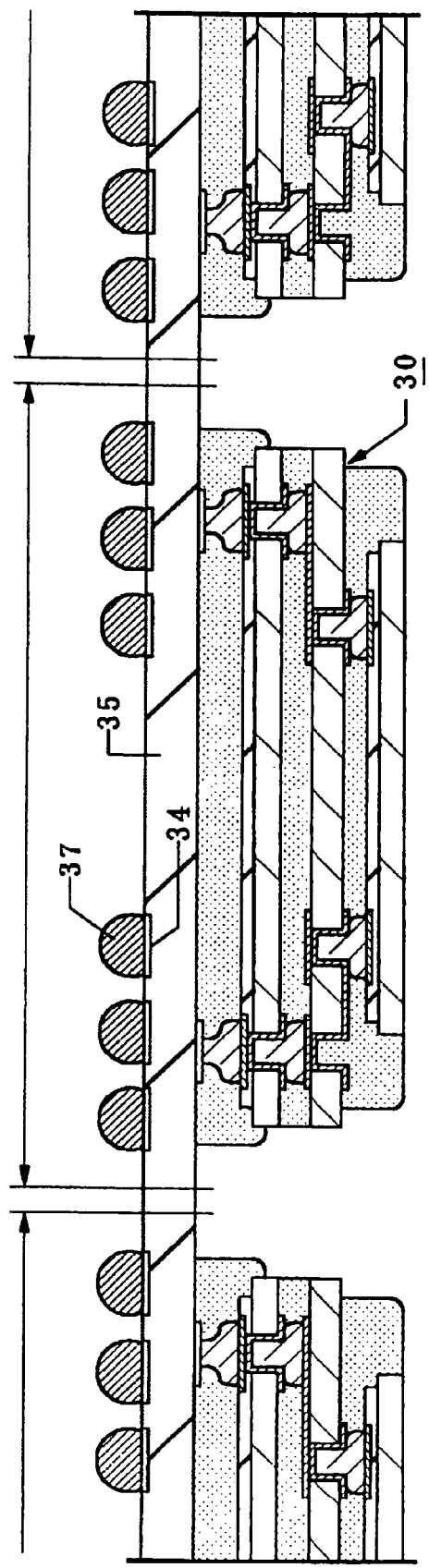
FIG. 17b is a schematic sectional view for explaining the manufacture of the semiconductor device in the embodiment 1 of the present invention.

Next, a multiple layout wiring substrate 35 as shown in FIG. 17*a* is prepared, having an array of several product forming zones 31 which are arranged in its planar direction and which are plotted by dicing zones (separating zones). Each product forming zone 31 has a configuration and a planar shape which are basically similar to those of the wiring substrate (mounting substrate) 36 as shown in FIG. 1. The multiple layout wiring substrate 35 is cut into a plurality of product forming zones 31 separated from one another.

Next, as shown in FIG. 17*a*, the product forming zone 31 of the multiple layout wiring substrate 35 is mounted thereon with the chip lamination 30. In detail, the chip lamination 30 is mounted in such a way that adhesive 26c made of a resin film or liquid rein has been laid on the product forming zone 31 of the multiple layout wiring substrate 31, then the chip lamination 30 is positioned on the product forming zone 31 so that the stud bump 9 of the semiconductor chip 1a is set on the electrode pad 33 of the product forming zone 31, and thereafter, the chip lamination 30 is pressed against the product forming zone 31. As the adhesive, there may be used a phenol group curing agent, silicone rubber or epoxy group thermosetting rein added therein with filler or the like. In this case, the chip lamination 30 is pressed while the adhesive 26c is heated.

Next, for example, a solder bump 37 serving as an external connection terminal is formed on the electrode pad 34 in each of the product forming zones 31 of the multiple layout wiring substrate 35. In detail, for example, a solder ball 37 is fed onto the electrode pad 34, and then, the solder ball 37 is fused into a solder bump, or alternatively, solder paste is printed on the electrode pad 34, and thereafter the solder paste is fused into a solder bump.

Next, in a method similar to the above-mentioned semiconductor wafer 20, the multiple layout wiring substrate 35 is diced along the dicing zones into a plurality of product forming zones separated from one another. Accordingly, the wiring substrate 36 formed from the product forming zone 31 is formed, and the semiconductor device as shown in FIG. 1 has been substantially completed.

In such a case that semiconductor chips having different kinds or sizes are laminated and connected to each other through the intermediary of the interposer chip 11, an actual product wafer has a size of 8 or 12 inches, depending upon a kind thereof, and accordingly, it is difficult to handle the semiconductor chips in a multipurpose use at its wafer level. On the contrary, the interposer chip 11 may be manufactured with an appropriate size, depending upon an infrastructure for assembly, and accordingly, there may be appropriated a multipurpose use assembly process in which semiconductor chips having different sizes are laminated on a wafer, as a base, on which the interposer chip 11 has been formed.

Thus, according this embodiment, a plurality of LSIs (semiconductor chips) to be three-dimensionally laminated are connected therebetween with shortest wiring lengths, and accordingly, the following technical effects may be exhibited:

(1) Since the hole is not filled therein with electrolytic plating or the like but only a thin metal plating film is formed in the rear surface side electrode part including the side wall of the hole, the necessity of a plating filling process incurring a long time and a subsequent CMP (Chemical Metal Polishing) process may be eliminated, thereby it is possible to manufacture a semiconductor device in a short TAT at low costs;

(2) the metal bumps filled in the piercing electrodes hole (in the recess of the concave electrode) through plastic flow during pressing, is stably held being joined with the plating electrode in the piercing electrode holes through their spring-back action, and accordingly, the electrical connection can be materialized by pressing at a room temperature. Further, the metal bumps have a linear expansion coefficient which is a larger than that of Si, and accordingly, calking may be obtained even during reflow heating due to thermal expansion, thereby it is possible to maintain a stable connection even at a high temperature;

(3) The process of connecting between the chips may be carried out by equipments similar to those used in a pressing process with the use of conventional gold stud bumps, and further, a heating process is not always required, (4) The connection between the upper and lower chips is made without through a mounting substrate (a package substrate), different from a method using wire-bonding, and accordingly, the mounting substrate is formed with only a wiring layer which is connected from a lowermost semiconductor chip to external electrodes, thereby it is possible to constitute a structure of two or four layer substrates. Accordingly, in comparison with currently used substrates which are formed of a multilayered build-up substrate, it is possible to aim at thinning a semiconductor device and lowering the costs thereof;

(5) In the case of lamination of different kinds of semiconductor chips, an interposer chip interposed, for example, between upper and lower chips in lamination may be formed even on the rear surface side with a rewiring layer, simultaneously, within a process range in which the piercing electrodes are formed. Thus, a two layer wiring layout may be substantially made, and accordingly, an inexpensive chip configuration having only one aluminum surface wiring layer may be normally used as the interposer chip. That is, in comparison with a connecting process, as disclosed in the prior art documents, using piercing electrodes, only a configuration and a process which are extremely inexpensive with a short TAT may be used, and an unique connection structure with a high degree of reliability may be materialized due to calking with the use of deformation of the metal bumps caused by plastic flow, thereby it is possible to provide a configuration of three-dimensional inter-chip connection which is highly practical;

(6) During a manufacture of semiconductor devices having a chip lamination in which a plurality of a semiconductor chips are three-dimensionally laminated one upon another, with the use of the semiconductor wafer 20 having a plurality of product forming zones 21 plotted by dicing zones 22, semiconductor chips may be mounted on each of the product forming zones 21 of the semiconductor wafer 20 under pressing in such a condition that the semiconductor wafer 20 is adhered to the glass substrate 25, thereby it is possible to aim at enhancing the production efficiency of the semiconductor devices; and (7) During a manufacture of semiconductor devices having such a configuration that the semiconductor chip 1a is laminated on the semiconductor chip 1b, the semiconductor chip 1a having a size larger than that of the semiconductor chip 1b, through the intermediary of the interposer chip 11, in the case of mounting the semiconductor chip 1a on the product forming zone 21 of the semiconductor wafer 20, since the foundation given by the resin 26a is formed underneath the connection part (the electrode pad 14a, 14b), even though the electrode pad 14 (14a, 14b) of the product forming zone 21 is located outside of the semiconductor chip 1b (that is, the size of the semiconductor chip 1a to be mounted is larger than that of the semiconductor chip 1b which has been always mounted), the stud bump 9 of the product forming zone 21 can be press-fitted into the recess 7 of the concave electrode 8 (8a, 8b) of the semiconductor chip 1a through deformation caused by plastic flow, without damaging the product forming zone 21, thereby it is possible to surely mount the semiconductor chip 1a under pressing. As a result, it is possible aim at enhancing the production yield of semiconductor devices.

(Variant 1)

FIG. 18 is a schematic sectional view illustrating an interposer chip in a variant 1 of the embodiment 1.

Although the concave electrode 14d is formed, as shown in FIG. 5, having a depth which extends to the electrode pad 14d formed on the principal surface 11x of the interposer chip 11, since the concave electrode 18d is electrically connected to the concave electrode 18b through the intermediary of the wiring 11n at the rear surface 11y of the interposer chip 1, it is not, in particular, necessary to directly connect the concave electrode 18d to the electrode pad 14d. Thus, as shown in FIG. 18, it may be formed so as to have a depth which does not extend to the principal surface 11x of the interposer chip 11 (a depth which is shorter than that of the embodiment 1). In this case, the hole 15 is formed having a depth which does not extend to the principal surface 11x of the interposer chip 11. Further, as shown in FIG. 18, the electrode pad 14d may be eliminated. Technical effects and advantages similar to those obtained in the embodiment 1 may also obtained even in this variant 1. However, the number of manufacturing steps becomes larger than that of the embodiment 1 since the holes 15 having different depths have to be formed.

(Variant 2)

FIG. 19 is a schematic sectional view illustrating a semiconductor chip in a variant 2 of the embodiment 1.

The electrode pad 4 of the semiconductor chip has a thin film structure having a thin thickness of several microns, there would be caused such a risk that the concave electrode 8 part (piercing electrode part) is broken by an external force which is applied thereto when the stud bump 9 is formed on the electrode pad 14 or when an assembly process is thereafter carried out. Accordingly, as shown in FIG. 19, the bottom part of the concave electrode 18 is partly increased so as to have a two step structure in order to enhance the mechanical strength on the electrode pad 4 side. This two step structure may be applied to the concave electrode 18 part (piercing electrode) of the interposer chip 11.

(Variant 3)

Figure 20:
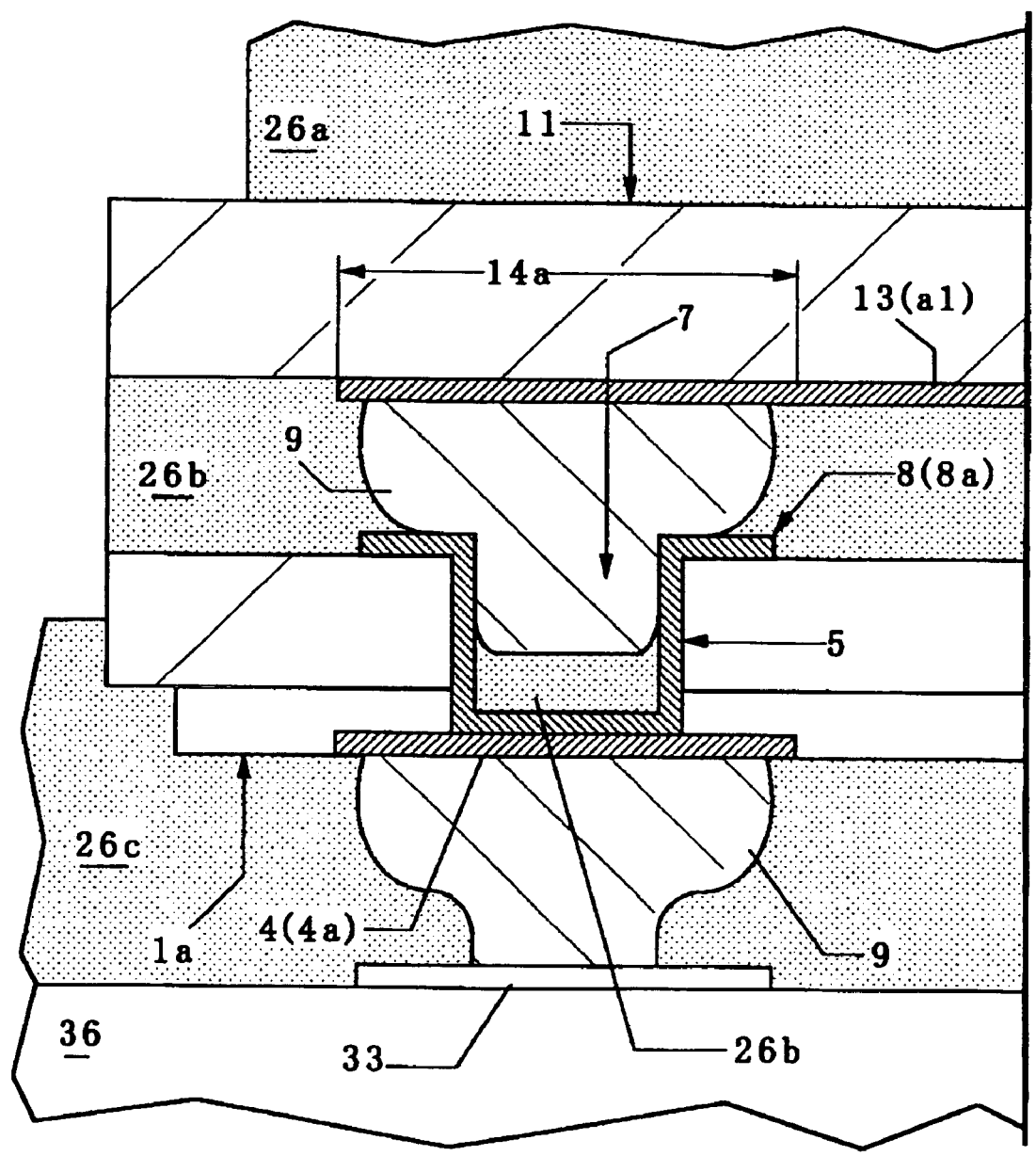
FIG. 20 is a schematic sectional view illustrating a chip lamination in a variant 3 of the embodiment 1 of the present invention.

FIG. 20 is a schematic sectional view illustrating a part of a chip lamination in a variant 3 of the embodiment 1.

Although explanation has been made of the method of connecting the concave electrode (8, 18) with the stud bump 9 in the embodiment 1 in which the recess 7 of the concave electrode 8a is completely filled therein with a part of the stud bump 9, the recess 7 of the concave electrode 8a may be filled therein with a part of the stud bump 9 and a part of the resin 26b.

(Variant 4)

Figure 21A:
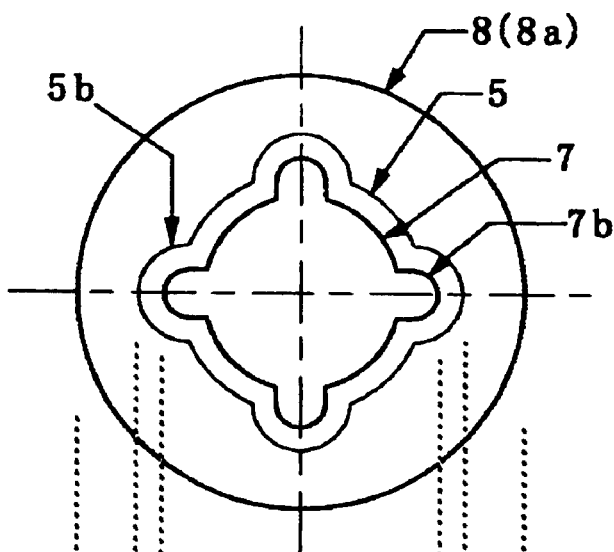
FIG. 21a is a schematic plan view illustrating a concave electrode in a variant 4 of the embodiment 1 of the present invention.
Figure 21B:
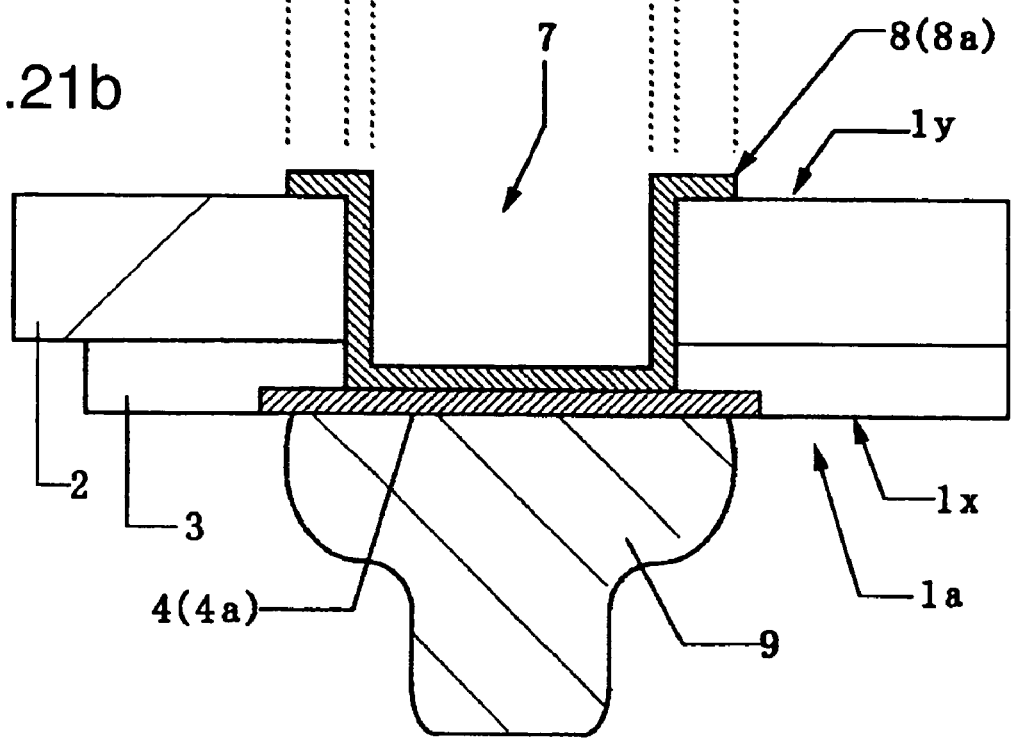

FIG. 21 is a schematic sectional view illustrating a part of a semiconductor chip in a variant 4 of the embodiment 1.

As to the concave electrode (8, 18), although the hole 5 (15) is formed so as to have a circular shape corresponding to the shape of the stud bump 9, as shown in FIGS. 9a and 9b, and the concave electrode 8 (18) having the circular recess 7 (17) is formed on the rear surface side of the semiconductor chip (and the interposer chip) so as to have a shape corresponding thereto, the circular hole 5 (15) and small semicircular holes 5b (15b) therearound are simultaneously formed so as to have a structure with air relief parts upon press-fitting the stud bump 9 into the recess 7 (17) of the concave electrode 8 (18) or zones through which adhesive resin is removed from the recess of the concave electrode if the adhesive resin has been prepared beforehand.

(Variant 5)

FIGS. 22a to 23d are schematic sectional views for explaining a manufacture of a semiconductor device in a variant 5 of the embodiment 1.

Although explanation has been made, in the embodiment 1, of such a method that the semiconductor chips 1a, 1b are three-dimensionally mounted on each of the product forming zones 21 of the semiconductor wafer 20 (Refer to FIG. 15b) before the semiconductor wafer 20 is diced along the dicing zones so as to form the plurality of product forming zones 21 separated from one another, explanation will be made of the variant 5 in which the semiconductor chip 1b is mounted before the semiconductor wafer 20 is diced into pieces, and the semiconductor chip 1a is mounted after the semiconductor wafer 20 is diced into pieces.

Figure 22A:
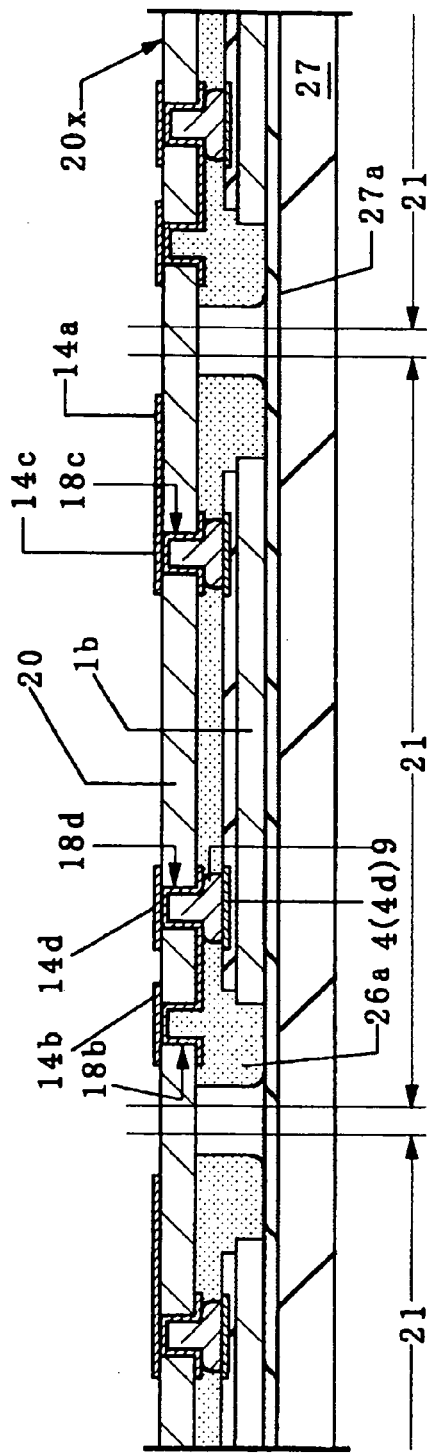
FIG. 22a is a schematic sectional view for explaining a manufacture of a semiconductor device in a variant 5 of the embodiment 1 of the present invention.

At first, the steps similar to those in the embodiment 1 is carried out until the glass substrate is peeled off from the semiconductor wafer 20 as shown in FIG. 22a. The dicing tape 27 is applied to the rear surface 1y of the semiconductor chip 1b mounted to each of the product forming zones 21 of the semiconductor wafer 20.

Figure 22B:
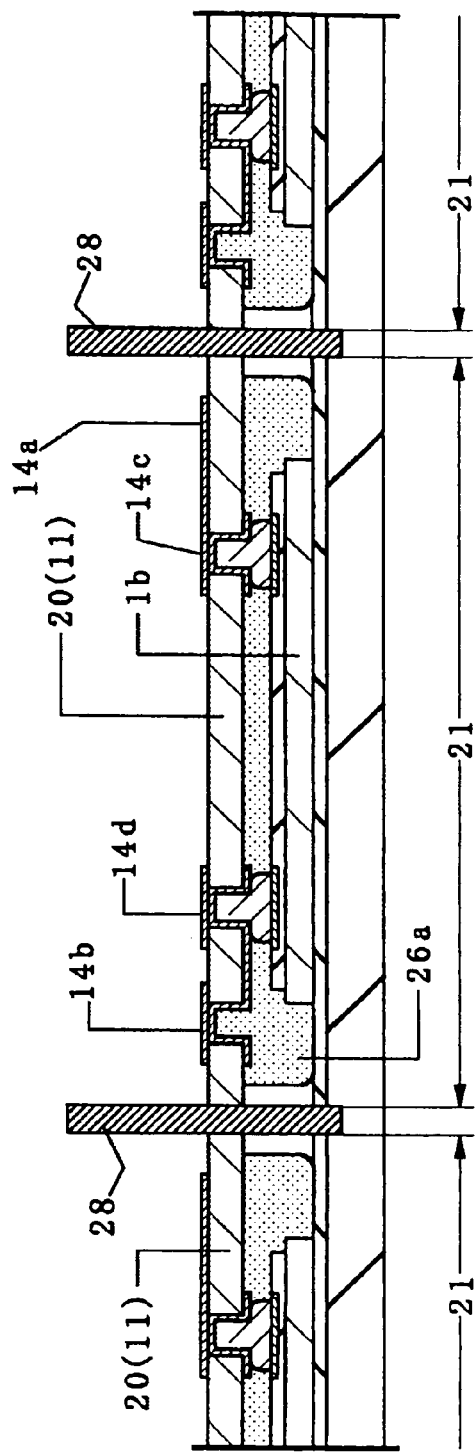
FIG. 22b is a schematic sectional view for explaining the manufacture of the semiconductor device in the variant 5 of the embodiment 1 of the present invention.
Figure 23A:
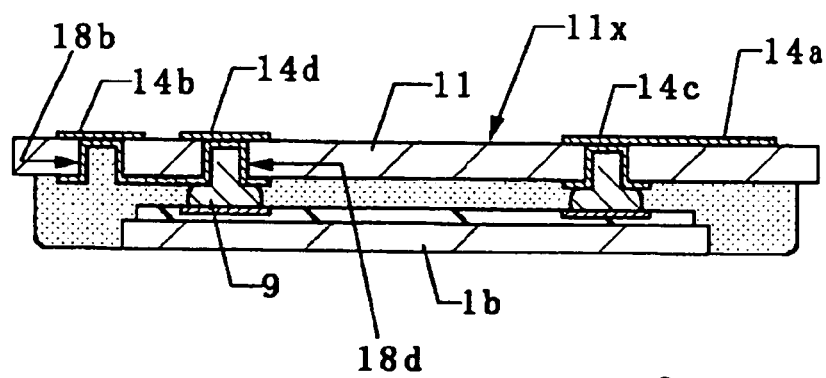
FIG. 23a is a schematic sectional view for explaining a manufacture of the semiconductor device, following FIG. 22b.

Next, as shown in FIG. 22b, the semiconductor wafer 20 is diced by, for example, the dicing blade 28 along the dicing zones 22 so as to separate the product forming zones from one another. Thus, as shown in FIG. 23(a), the interposer chip 11 formed from the product forming zone 21 is obtained, being mounted thereto at its rear surface 11y with the semiconductor chip 1b. FIG. 23a shows such a condition that the interposer chip 11 is removed from the dicing tape 27.

Figure 23B:
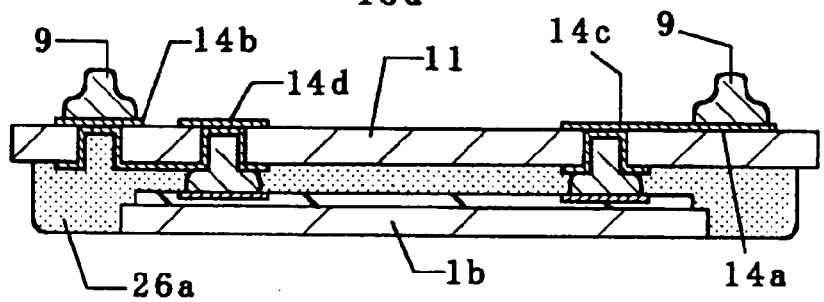
FIG. 23b is a schematic sectional view for explaining the manufacture of the semiconductor device, following FIG. 22b.

Next, as shown in FIG. 23b, the stud bump 9 is formed on the electrode pad 14 (14a, 14b) of the interposer chip 11 by, for example, a ball bonding process. The stud bump 9 is formed in such a condition that the semiconductor wafer 20 is mounted on the bonding stage (treatment bed) through the intermediary of dicing tape 27 on the rear surface 1y of the semiconductor chip 1b although it is not shown.

At this step, since the foundation formed of the resin 26a is present underneath the electrode pad 14 (14a, 14b) of the interposer chip 11, the electrode pad 14 (14a 14b) and the stud bump 9 may be surely joined to each other, similar to the embodiment 1 as stated above.

Figure 23C:
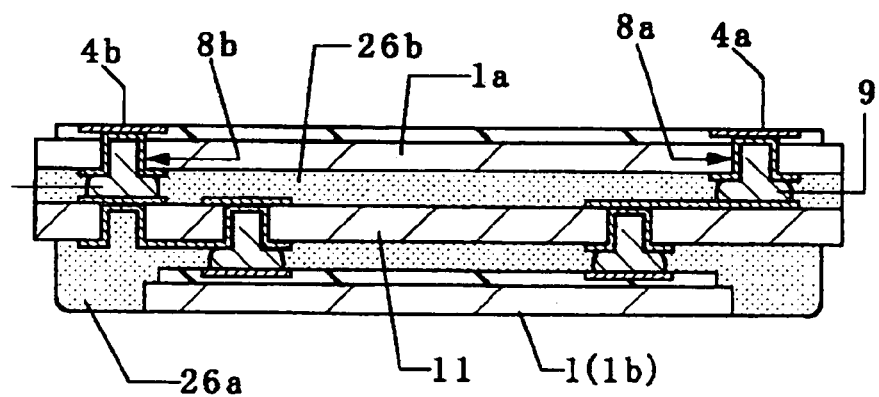
FIG. 23c is a schematic sectional view for explaining the manufacture of the semiconductor device, following FIG. 23b.

Next, as shown in FIG. 23c, the semiconductor chip 1a is mounted on the principal surface 11x side of the interposer chip 11. In detail, the semiconductor chip 1a is positioned on the interposer chip 11 so that the concave electrode 8 (8a, 8b) of the semiconductor chip 1a is set on the stud bump 9 formed on the electrode pad 14 (14a, 14b) of the interposer chip 11, and thereafter the semiconductor chip 1a is pressed against the interposer chip 11 in order to mount the semiconductor chip 1a on the interposer chip 11. The mounting of the semiconductor chip 1a is carried out in such a condition that the rear surface 1y of the semiconductor chip 1b is set on the bonding stage (treatment bed) although it is not shown.

At this step, the stud bump 9 of the product forming zone 21 is press-fitted into the recess 7 of the concave electrode 8 (8a, 8b) of the semiconductor chip 1a through deformation caused by plastic flow, and is electrically and mechanically connected to the concave electrode 8 (8a, 8b).

Further, s shown in FIG. 15a, resin 26 is filled between the produce forming zone 21 and the semiconductor chip 1a so as to seal the rear surface 1y of the semiconductor chip 1a and to adhere and fix the semiconductor chip 1a to the product forming zone 21.

Further, at this step, since the foundation formed of the resin 26a is present underneath the electrode pad 14 (14a, 14b) of the interposer chip 11, the semiconductor chip 1a may be surely mounted under pressing as in the embodiment 1 as stated above.

Figure 23D:
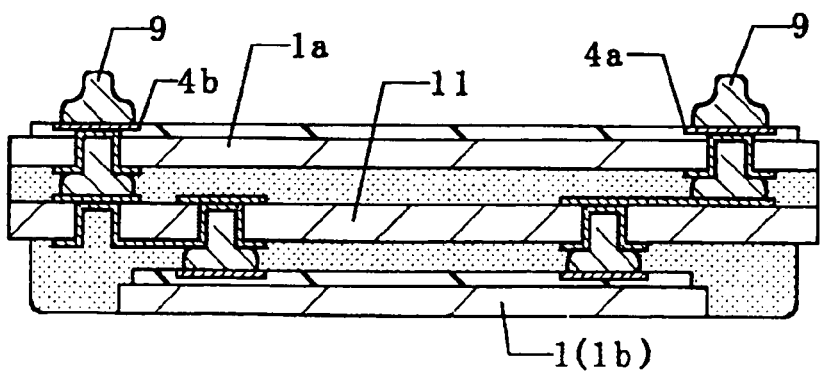
FIG. 23d is a schematic sectional view for explaining the manufacture of the semiconductor device, following FIG. 23c.

Next, referring to FIG. 23d, the stud bump 9 is formed on the electrode pad 4 (4a, 4b) of the semiconductor chip 1a by, for example, a ball bonding process. The stud bump 9 is formed in such a condition that the rear surface 1*y* of the semiconductor chip 1*b* is set on the bonding stage (treatment bed) although it is not shown.

At this step, the stud bump 9 formed on the electrode pad 14 (14*a*, 14*b*) of the interposer chip 11 is press-fitted into the recess 7 of the concave electrode 8 (8*a*, 8*b*) which is planarly overlapped with the electrode pad 4 (4*a*, 4*b*) of the semiconductor chip 1*a*, and further, since the foundation formed of the resin 26*a* is present underneath the electrode pad 14 (14*a*, 14*b*) of the interposer chip 11, the electrode pad 4 (4*a*, 4*b*) and the stud bump 9 are surely joined to each other, similar to the embodiment 1.

Further, at this step, there may be formed the chip lamination 30 in which the semiconductor chips (1*a*, 1*b*) having different external sizes are laminated one upon another through the intermediary of the interposer chip 11.

Thereafter, the semiconductor device is substantially completed through steps similar to those stated in the embodiment 1.

Thus, even variant 5 may exhibit technical effects and advantages similar to those obtained in the embodiment 1.

(Variant 6)

Figure 24A:
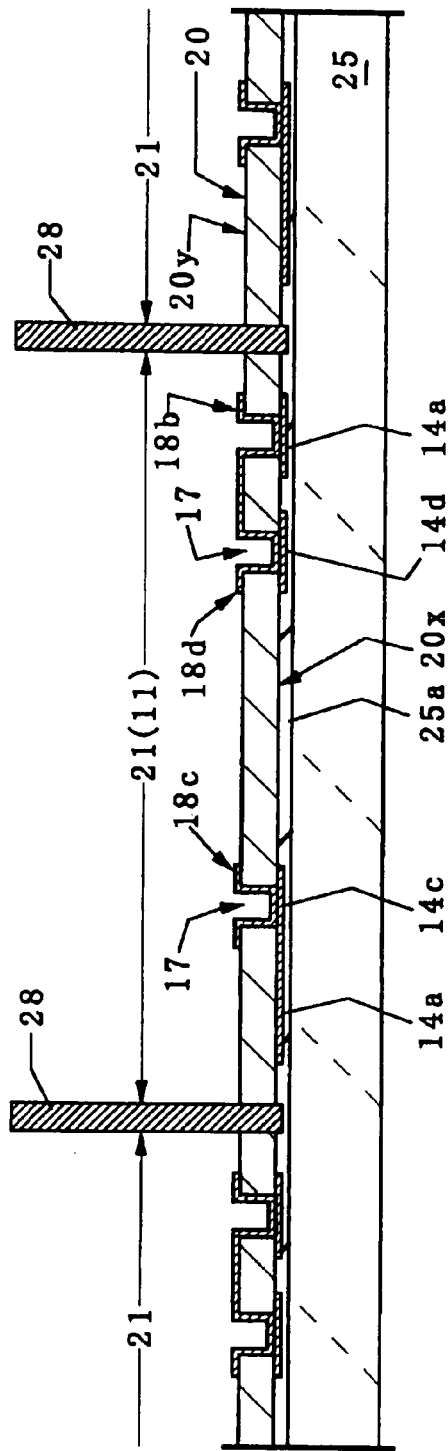
FIG. 24a is a schematic sectional view for explaining a manufacture of a semiconductor device in a variant 6 of the embodiment 1 of the present invention.
Figure 24B:
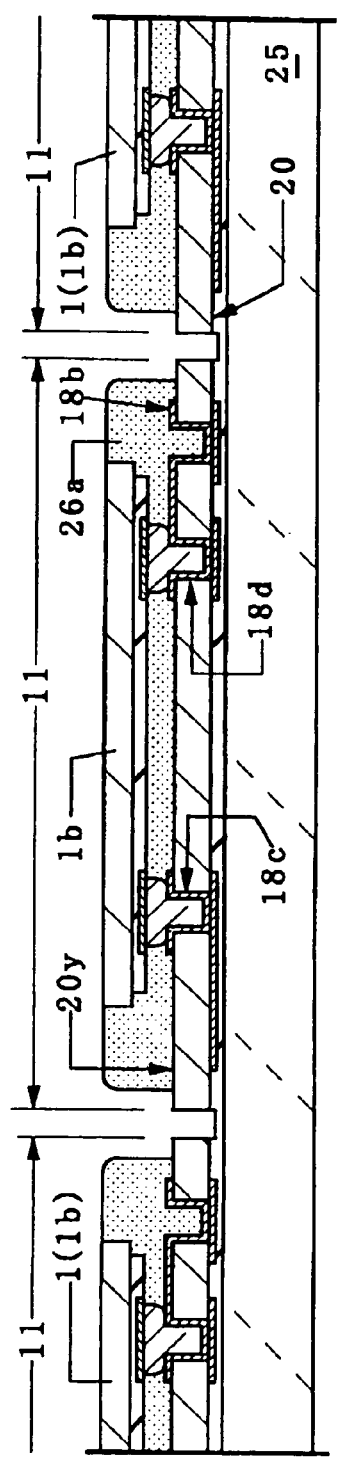
FIG. 24b is a schematic sectional view for explaining the manufacture of the semiconductor device in the variant 6 of the embodiment 1 of the present invention.

FIGS. 24*a* and 24*b* are schematic sectional views for explaining a manufacture of a semiconductor device in a variant 6 of the embodiment 1.

Although explanation has been made of the variant 5 in which the semiconductor chip 1*b* is mounted before the semiconductor wafer 20 is diced into pieces (Refer to FIG. 22*a*) while the semiconductor chip 1*a* is mounted after the semiconductor wafer 20 is diced into pieces (Refer to 23*c*), the semiconductor device in the variant 6 is formed as follows: as shown in FIG. 24*a*, the semiconductor wafer 20 which is applied to the glass substrate 25 is diced along the dicing zones 22 by, for example, a dicing blade 28, so as to obtain the product forming zones 21 separated from one another. Then, as shown in FIG. 24*b*, the semiconductor chip 1*b* is mounted on the rear surface 1*y* of each of the interposer chips 11 which are applied on the glass substrate 25 in a method similar to that of the embodiment 1, and thereafter, each of the interposer chips 11 is peeled off from the glass substrate 25, similar to the method in the embodiment 1. Finally, the semiconductor chip 1*a* is mounted on the principal surface 11*x* side of the interposer chip 11 in a method similar to that of the variant 5. Even the manufacture in the variant 6 may exhibit technical effects and advantages similar to those obtained by the embodiment 1 as stated above.

Embodiment 2

Figure 26:
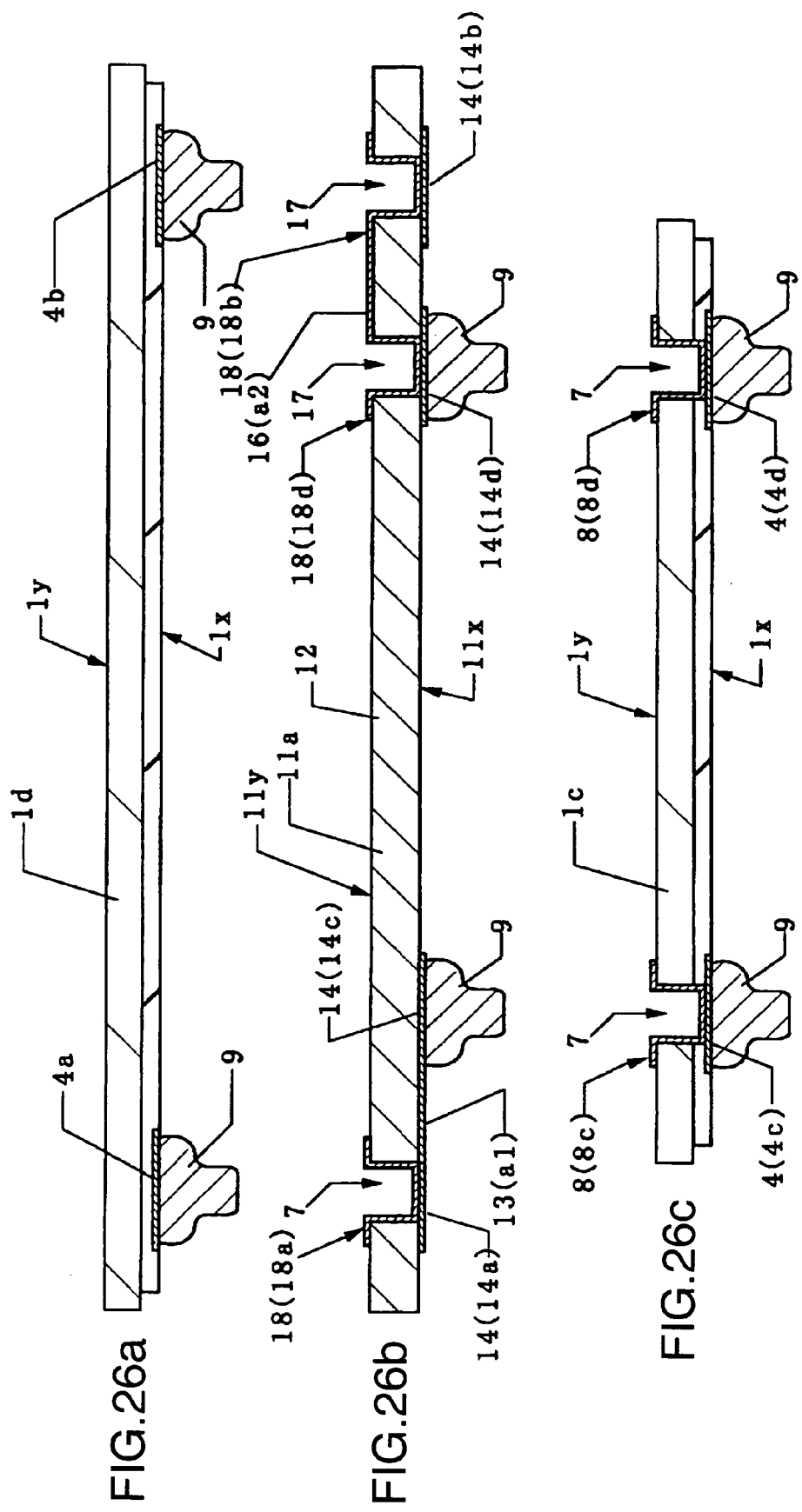
FIG. 26a is a schematic sectional view illustrating a configuration of a semiconductor chip located at the uppermost stage of a chip lamination shown in FIG. 25.
FIG. 26b is a schematic sectional view illustrating a configuration of an interposer chip.
FIG. 26c is a schematic sectional view illustrating a configuration of a semiconductor chip located at the lowermost stage.

FIGS. 25 to 26*c* show a semiconductor device in an embodiment 2 of the present invention, in which FIG. 25 is a schematic sectional view illustrating a configuration of the semiconductor device, FIG. 26*a* is a schematic sectional view illustrating a semiconductor chip located at the uppermost stage of a chip lamination, FIG. 26*b* is a schematic sectional view illustrating an interposer chip and FIG. 26*c* is a schematic sectional view illustrating a semiconductor chip located at the lowermost stage.

The semiconductor device in this embodiment 2 has the same configuration as that of the embodiment 1, except that the chip lamination has a different structure. As shown in FIG. 25, in the chip lamination 30*a* in this embodiment 2, a semiconductor chip 1*d* is laminated on a semiconductor chip 1*a* through the intermediary of an interposer chip 11*a*, the semiconductor chip 1*d* having an external size which is larger than that of the semiconductor chip 1*c*.

The upper stage semiconductor chip 1*d* basically has a configuration similar to that of the semiconductor chip 1*a* as stated above, except having no concave electrode 8, as shown in FIG. 26*a*.

The lower stage chip 1*c* basically has the same configuration as the semiconductor chip 1*b* of the embodiment 1, except that concave electrodes 8 (8*c*, 8*d*) are formed corresponding to electrode pads 4 (4*c*, 4*d*), as shown in FIG. 26*c*. The concave electrode 8 (8*c*, 8*d*) has a recess 7 depressed from the rear surface 1*y* side of the semiconductor chip 1*c* to the electrode pad 4, and is electrically and mechanically connected to the electrode pad 4 (4*c*, 4*d*).

The interposer chip 11*a* at the middle stage basically has the same configuration as that of the interposer chip 11 as stated above, except that the stud bumps 9 are provided on the electrode pads 14*c*, 14*d*, and a concave electrode 18*a* is provided corresponding to the electrode pad 14*a*, but no concave electrode 18*c* is provided, corresponding to the electrode pad 14*c*. The concave electrode 18*a* has a recess 7 which is depressed from the rear surface 11*y* side of the interposer chip 11*a* toward the electrode pad 14*a*, and is electrically and mechanically connected to the electrode pad 14*a*.

As shown in FIG. 25, a part of the stud bump 9 arranged on (connected to) the electrode pad 14*c* of the interposer chip 11*a* and a part of the stud bump arranged on (connected to) the electrode pad 14*d* of the interposer chip 11*a* are press-fitted respectively in the recess 7 of the concave electrode 8*c* of the semiconductor chip 1*c* located at the lower stage and the recess 7 of the concave electrode 8*d* of the semiconductor chip 1*c* located at the lower stage, through deformation caused by plastic flow, and the electrode pads (14*c*, 14*d*) of the interposer chip 11*a* are electrically connected to the electrode pads (4*c*, 4*d*) of the lower stage semiconductor chip 1*c*, respectively.

As shown in FIG. 25, a part of the stud bump 9 arranged on (connected to) the electrode pad 4*a* of the semiconductor chip 1*d* located at the upper stage, and a part of the stud bump 9 arranged on (connected to) the electrode pad 4*b* of the semiconductor chip 1*d* located at the upper stage are press-fitted respectively in the recess 17 of the concave electrode 18*a* of the interposer chip 11*a* and the recess 17 of the concave electrode 18*b* of the interposer chip 11*a*, through deformation caused by plastic flow. The electrode pads (4*a*, 4*b*) of the upper stage semiconductor chip 1*d* are electrically connected respectively to the electrode pads (14*a*, 14*d*) of the interposer chip 11*a*.

That is, the electrode pad 4*c* of the lower stage semiconductor chip 1*c* and the electrode pad 4*a* of the upper stage semiconductor chip 1*d* are electrically connected to each other through the intermediary of a first conductive path including the concave electrode 8*c*, the stud bump 9, the electrode pad 14*c*, a wiring 14*n*, the electrode pad 14*a*, the concave electrode 18*a* and the stud bump 9 which are arranged in the mentioned order from the electrode pad 4*c* side of the semiconductor chip 1*c*. Further, the electrode pad 4*d* of the lower stage semiconductor chip 1*c* and the electrode pad 4*b* of the upper stage semiconductor chip 1*d* are electrically connected to each other through the intermediary of a second conductive path including the concave electrode 8*d*, the stud bump 9, the electrode pad 14*d*, the concave electrode 18*d*, a wiring 18*n*, the concave electrode 18*b* and the stud bump 9 which are arranged in the mentioned order from the electrode pad 4*d* side of the semiconductor chip 1*c*.

Thus, even the semiconductor device in the embodiment 2 may exhibit technical effects and advantages similar to those obtained in the first embodiment 1.

Figure 27:
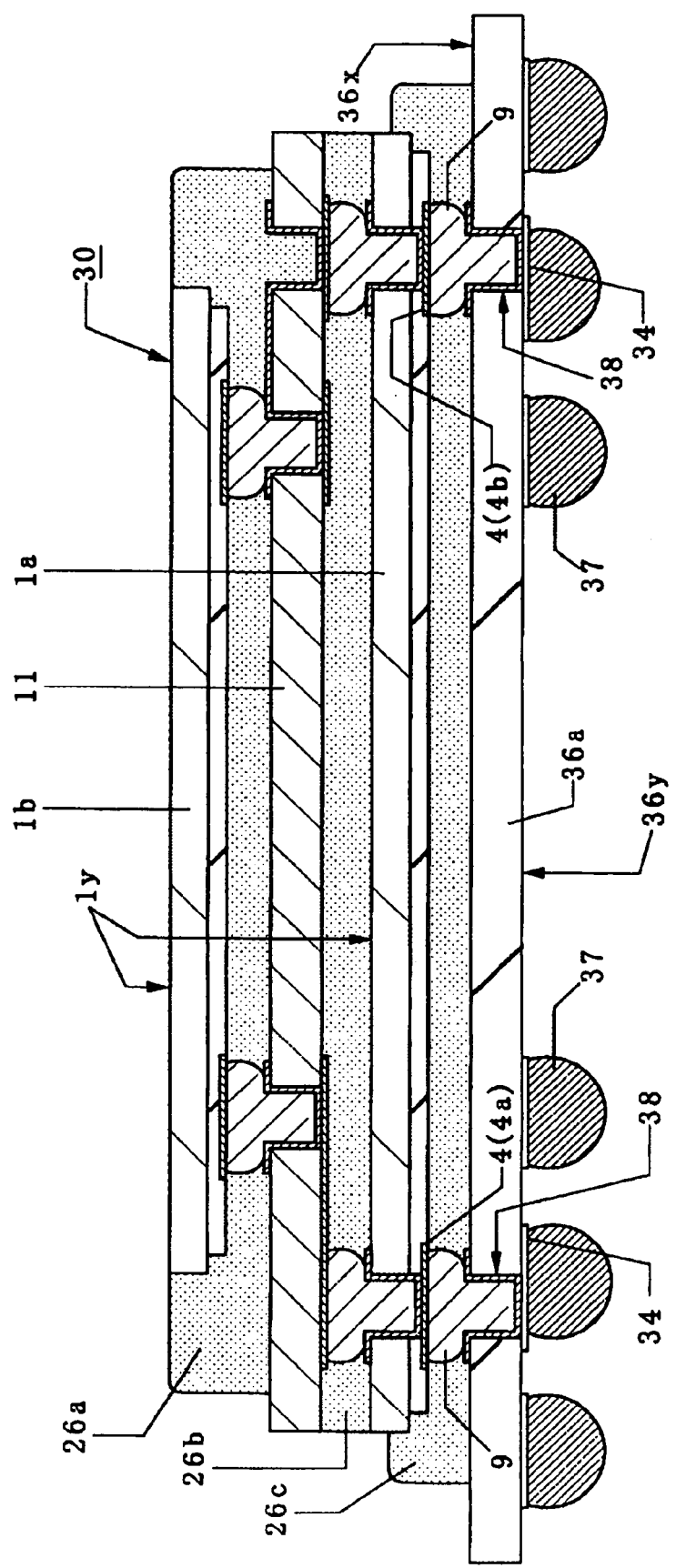
FIG. 27 is a schematic sectional view illustrating a configuration of a semiconductor device in an embodiment 3 of the present invention.

FIG. 27 is a schematic sectional view illustrating a configuration of a semiconductor device in an embodiment 3 of the present invention.

The semiconductor device in the embodiment 3 basically has the same configuration as that of the embodiment 1, except that the wiring substrate (a mounting substrate or a package substrate) mounted thereon with a chip lamination has a different structure.

The wiring substrate (the mounting substrate or the package substrate) 36a in the embodiment 3 has concave electrodes 38 arranged corresponding to the stud bumps 9 (or the electrode pads 4) of the lowermost stage semiconductor chip 1a. The concave electrode 38 has a recess depressed from the principal surface 36x side of the wiring substrate 36a toward the rear surface 36y thereof, and is electrically and mechanically connected with the electrode pad 34. The concave electrode 38 is formed along the inner wall surface of a hole which extends from the principal surface 36x of the wiring substrate 36a to the electrode pad 34 at the rear surface 36y of the wiring substrate 36a, similar to the concave electrode 8 of the semiconductor chip 1a, and is led out onto the principal surface 36x of the wiring substrate 36a so as to cover the rear surface of the electrode pad 34. That is, the wiring substrate 36a in the embodiment 3 has a piercing electrode composed of the electrode pad 34 and the concave electrode 38 connected to the electrode pad 34, similar to the interposer chip 11a.

The wiring substrate 36a is formed of a double-surface two layer flexible substrate in which wiring layers are formed on front and rear opposite surfaces of, for example, a polyimide group base film (UPILEX™, KAPTON™ or the like), and the wiring layers on the front and rear opposite surfaces are electrically connected to each other through the intermediary of piecing electrodes (the concave electrode 38 and the electrode pad 34). Although a hole in the semiconductor chip is preferably formed by dry etching, the wiring substrate 36a formed therein with a hole extending to the rear surface side wiring layer through the base film layer is formed by irradiating a laser (excimer laser or ultraviolet laser) beam thereonto, and a plating electrode (concave electrode 38) is formed along the hole. The base film material is insulating, and accordingly, no additional insulating process is required in comparison with the semiconductor chip, thereby it is possible to manufacture a two layer substrate with concave electrodes for connecting between a chip and a mounting substrate with the use of a simple and inexpensive process.

The embodiment 3 exhibits the following technical effects and advantages in comparison with the embodiments 1 and 2 as stated above:

(1) In comparison with the embodiment 1 in which a process at a high temperature is indispensable since the lowermost stage chip and the mounting substrate are connected through a conventional flip chip connection process, the connection to the mounting substrate in this embodiment 3 may be connected at a room temperature. Thus, no temperature gradation is required in the connection process, and accordingly, it is advantageous for fine connection.

(2) Since the polyimide group film is used as its base, the two layer substrate has a thin thickness of 30 to 50 μm, and accordingly, it is possible to further thin the semiconductor device.

Embodiment 4

Figure 28:
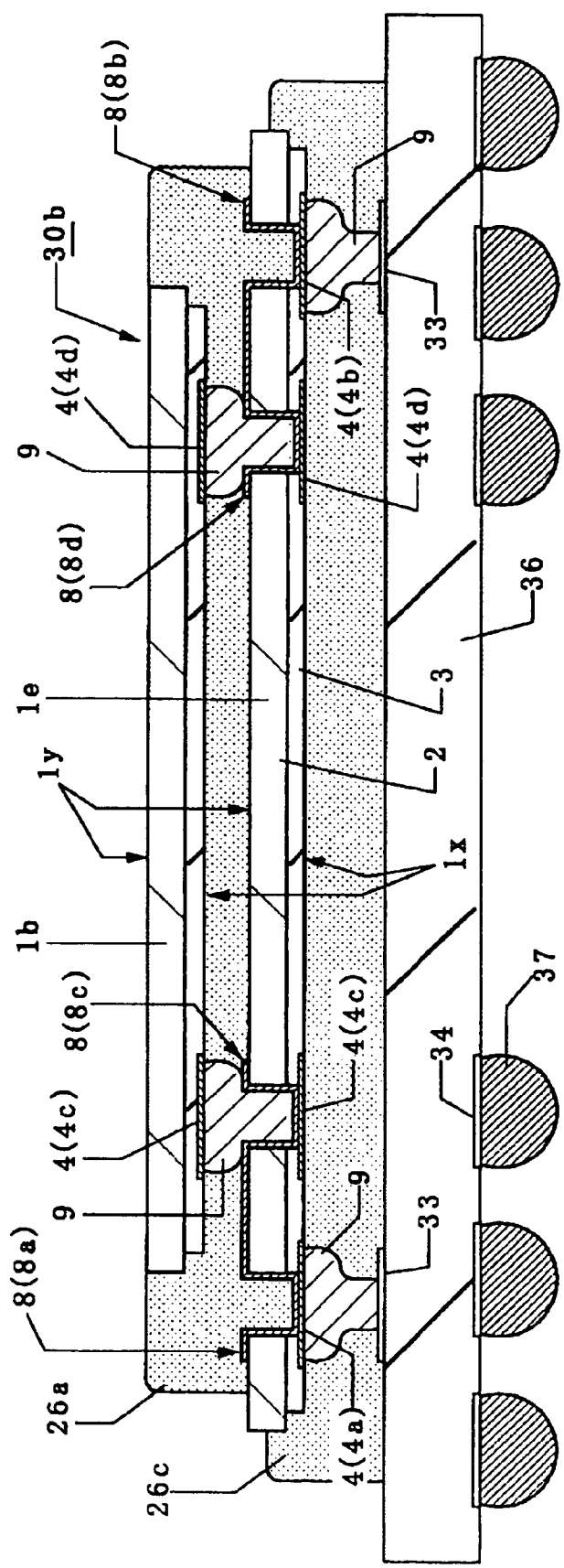
FIG. 28 is a schematic sectional view illustrating a configuration of a semiconductor device in an embodiment 4 of the present invention.

FIG. 28 is a schematic sectional view illustrating a configuration of a semiconductor device in an embodiment 4.

Explanation has been made of the three-dimensional lamination of different kinds of upper and lower semiconductor chips between which the interposer chip 11 is interposed in order to materialize operative three-dimensional connection between the upper and lower semiconductor chips in the embodiment 1. However, in this embodiment 4, concave electrodes (8a, 8b) are formed at electrode positions (electrode pads 4a, 4b) on the rear surface 1y side of a lower stage semiconductor chip 1e, at which connection to an upper stage semiconductor chip is required, and simultaneously, a rewiring layer connected thereto and concave electrodes (8a, 8d) connected to the upper stage semiconductor chip 1b are formed. Thus, the upper stage semiconductor chip 1b is electrically connected to the lower stage semiconductor chip 1e, direct thereto.

Thus, there may be obtained the following technical effects and advantages in comparison with the above-mentioned embodiment 1:

(1) No interposer chip is required so as to enable three-dimensional connection in a short TAT at lower costs. However, as prerequisite conditions for application of this embodiment, the joint zone of the upper stage semiconductor chip has to be not greater than a size of the lower stage semiconductor chip, and it is required to obtain a pin arrangement which is appropriate for connection between the upper and lower stage semiconductor chips and which is possible only in one rewiring layer since a multi-layer layout is difficult on the rear surface side of the lower stage semiconductor chip; and (2) The length or wiring for connection between the upper and lower stage semiconductor chips is shortened, thereby it is possible to aim at reducing the rewiring inductance.

Figure 29:
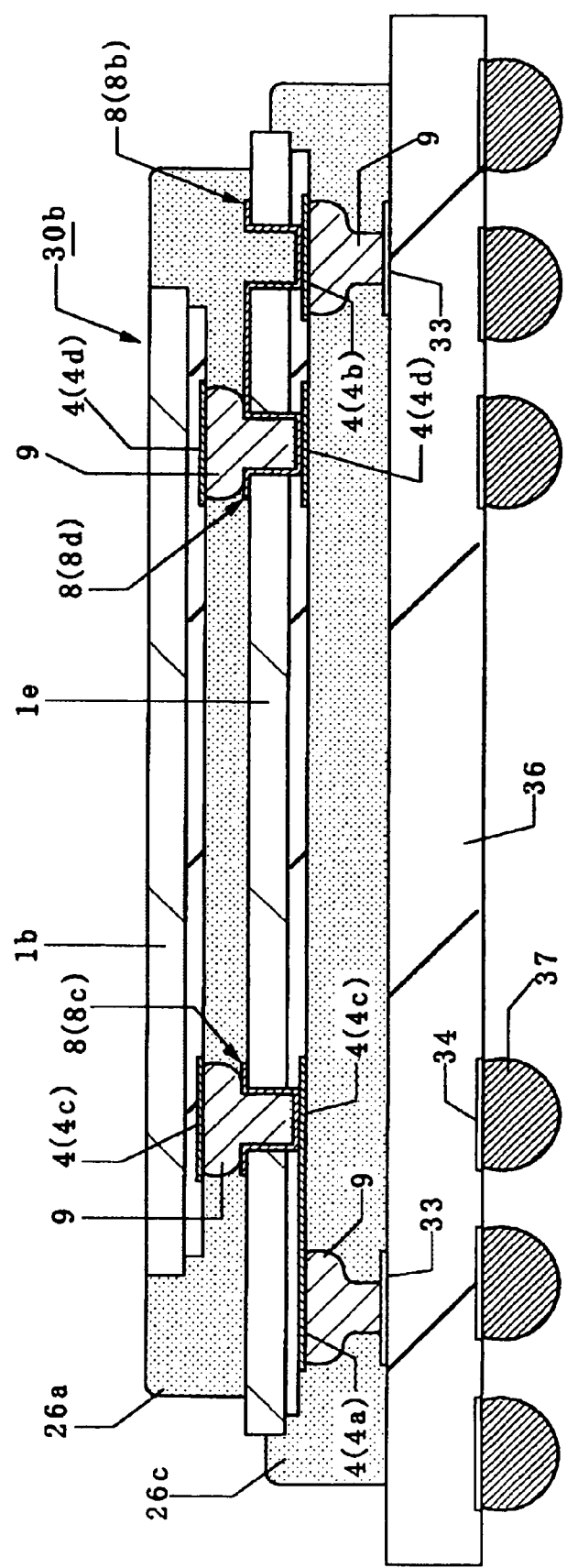
FIG. 29 is a schematic sectional view illustrating a configuration of a variant of the embodiment 4 of the present invention.

FIG. 29 is a schematic sectional view illustrating a configuration of a semiconductor device in a variant of the embodiment 4.

In the embodiment 4, the concave electrodes 8a, 8c are electrically connected to each other through the intermediary of the wiring on the rear surface 1y side of the semiconductor chip 1a. However, as shown in FIG. 29, without the concave electrode 8a, the electrode pads 8a, 8c may be electrically connected to each other through the intermediary of wiring on the principal surface 1x side of the semiconductor chip 1a.

Embodiment 5

Figure 30:
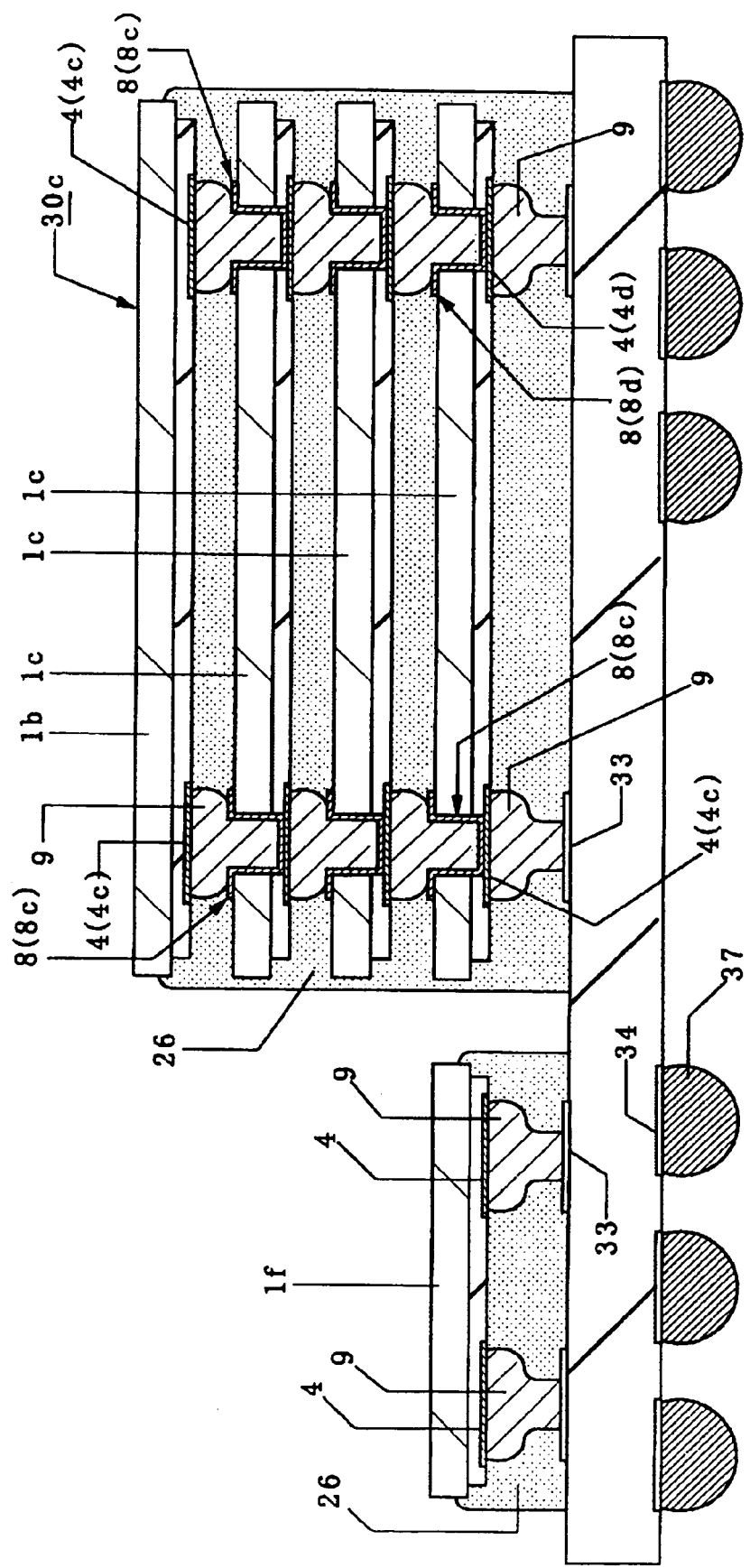
FIG. 30 is a schematic sectional view illustrating a configuration of a semiconductor device in an embodiment 5 of the present invention.

FIG. 30 is a schematic section view illustrating a configuration of a semiconductor device in an embodiment 5 of the present invention.

Figure 31:
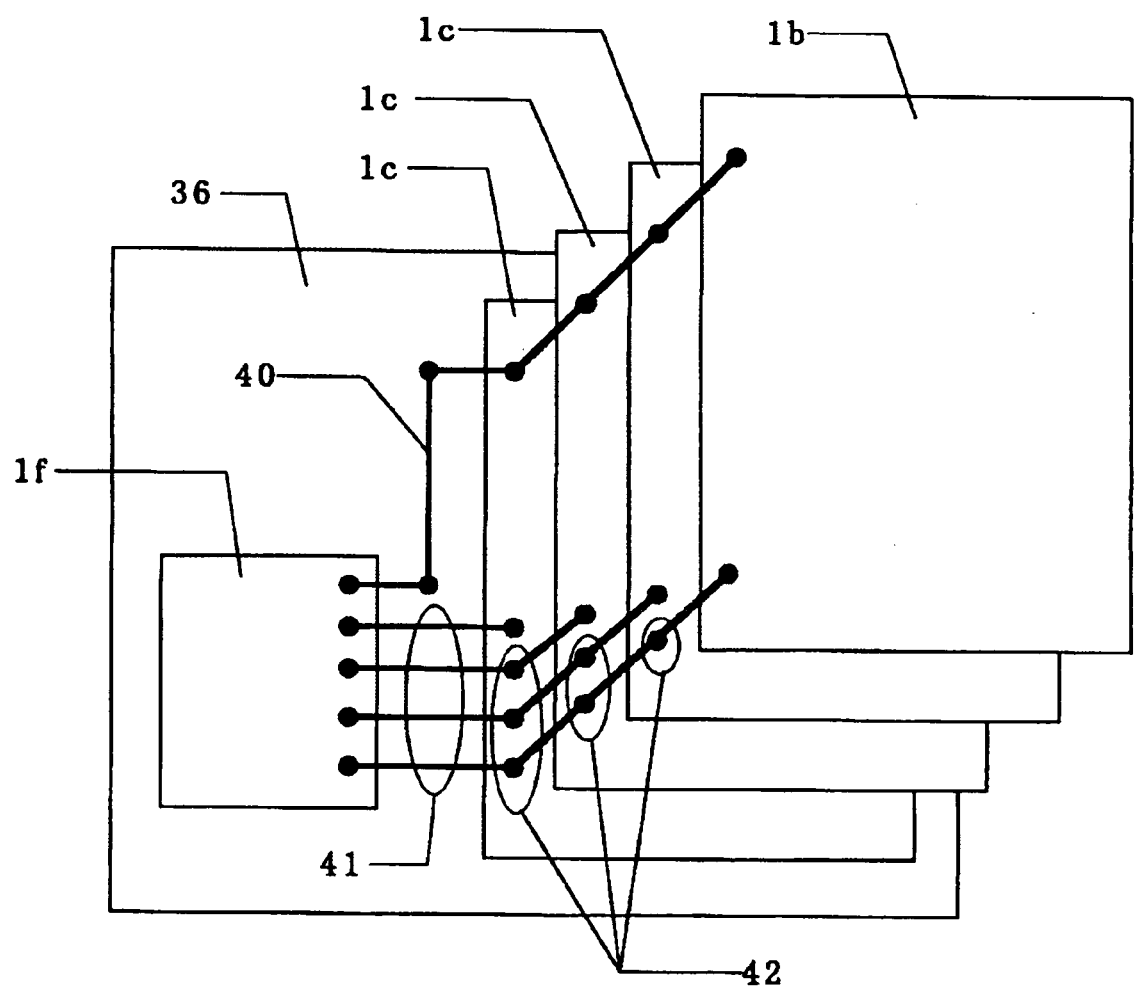
FIG. 31 is a block diagram illustrating a wiring layout of the semiconductor device shown in FIG. 30.

FIG. 31 is a block diagram illustrating wiring connection of the semiconductor device shown in FIG. 30.

The semiconductor device in this embodiment 5 has a chip lamination 30c in which a plurality of, for example, memory group semiconductor chips of the same kind are three-dimensionally laminated one upon another on the principal surface 36x of the wiring substrate 36, and also has a chip select semiconductor chip 1f for selecting a semiconductor chip in the chip lamination 30c. The chip select semiconductor chip 1f is arranged in parallel with the chip lamination 30c.

In the chip lamination 30c, the lowermost stage semiconductor chip 1c has its principal surface 1x which faces a principal surface 36x of a wiring substrate 36, and resin 36 is interposed between the principal surface 1x and the principal surface 36x of the wiring substrate 36 so as to adhere and fix the lowermost semiconductor chip 1c to the wiring substrate 36. A stud bump 9 of the lowermost stage semiconductor chip 1c is made into press contact with an electrode pad 33 of the wiring substrate 36 due to thermal shrinkage force and thermo-curing shrinkage force of the resin 26, and accordingly, is electrically connected to the electrode pad 33.

In the configuration of two semiconductor chips (1c and 1c and 1c and 1b) which are adjacent (faced) to each other in the chip lamination 30c, a stud bump 9 arranged on a semiconductor chip located at the upper stage, have a part which is press-fitted in a recess 7 of a concave electrode 8 of a semiconductor chip located at the lower stage so as to be electrically connected to an electrode pad 4 of the lower stage semiconductor chip. Between the upper and lower stage semiconductor chips, pins are electrically connected in a straight line-like manner. The resin 26 is filled between the upper and lower stage semiconductor chips.

The chip select semiconductor chip 1f has its principal surface 1x which faces the principal surface 36x of the wiring substrate 36, the resin 26 being interposed between the principal surface 1x and the principal surface 36x of the wiring substrate 36, so as to be adhered and fixed to the principal surface of the wiring substrate 36. A stud bump 9 of the chip select semiconductor chip 1f is made into press contact with an electrode pad 33 of the wiring substrate 36 due to thermal shrinkage force and thermal-curing shrinkage force of the resin 26 so as to be electrically connected to the electrode pad 33.

Referring to FIG. 31 which schematically shows a method of connecting the semiconductor chips (1c, 1b) in the chip lamination 30c to the chip select semiconductor chip 1f, the ground pins of each of the memory group semiconductor chips (1c, 1b) and the chip select semiconductor chip 1f are connected to each other through the intermediary of a ground line including the wiring of the wiring substrate 36. Select pins of each memory group semiconductor chip (1c, 1b) and the chip select semiconductor chip 1f are connected to each other through the intermediary of a chip select address line including the wiring of the wiring substrate 36.

Since address signals inputted for chip select must be independent from each other, electrical connection to the lowermost stage semiconductor chip 1c is made directly through the intermediary of the wiring substrate 36, but electrical connection to an upper stage semiconductor chip other than the lowermost stage one is made through the intermediary of electrodes of a lower stage semiconductor chip. Accordingly, the lower stage side semiconductor chips are incorporated therein with a plurality of dummy electrodes 42 for passing an address signal from the upper stage side semiconductor chip therethrough, depending upon a number of laminated semiconductor chips. It is noted that the input of address signals may be made through external electrodes which is not mounted on one and the same substrate.

Although explanation have been specifically made of the preferred embodiments of the present invention, the present invention should not be limited to these embodiments, but several modifications and changes may be, of course, made thereto without departing the conception and the technical scope of the present invention.

The invention claimed is:

1. A semiconductor device comprising a first semiconductor chip and a second semiconductor chip each having a principal surface and a rear surface, and a first wiring substrate laminated on the second semiconductor chip on the principal surface side thereof and on the rear surface side of the first semiconductor chip,
the first semiconductor chip including a first concave electrode formed on the rear surface side thereof;
the second semiconductor chip including a first electrode pad formed on the principal surface thereof, and a first protrusion electrode formed on the first electrode pad, and
the first wiring substrate having a principal surface and a rear surface, and including: a first electrode pad formed on the principal surface side thereof, a first protrusion electrode formed on the first electrode pad, a first concave electrode having a recess formed from the rear side surface thereof to the first electrode pad, and connected to the first electrode pad, a second concave electrode having a recess formed from the rear surface to the principal surface thereof, and a first wiring formed on the rear surface side thereof, for electrically connecting the first concave electrode with the second concave electrode,
wherein a part of the first protrusion electrode of the first wiring substrate is press-fitted in the recess of the first concave electrode of the first semiconductor chip, and a part of the first protrusion electrode of the second semiconductor chip being press-fitted in the recess of the second concave electrode of the first wiring substrate through deformation caused by plastic flow.

2. A semiconductor device as set forth in claim 1, wherein each of the concave electrodes is formed of a plating film.

3. A semiconductor device as set forth in claim 1, wherein the recess of each of the concave electrodes has an inner diameter which is inwardly wider in at least a part thereof, and
the part of each of the protrusion electrodes is geometrically calked in the recess of the associated concave electrode.

4. A semiconductor device as set forth in claim 1, wherein each of the protrusion electrodes is an Au stud bump or an Au plating bump, and
each of the concave electrodes is formed of a Cu plating film or an Au plating film.

5. A semiconductor device as set forth in claim 1, wherein the first semiconductor includes a first electrode pad formed on the principal surface side thereof, and connected to the first electrode, and a first protrusion electrode formed on the first electrode pad, and chip is mounted on a second wiring substrate through the intermediary of protrusion electrodes.

6. A semiconductor device as set forth in claim 1, wherein the first semiconductor chip is mounted thereon with a microcomputer or a logic circuit, and
the second semiconductor chip is mounted thereon with a memory circuit.

7. A semiconductor device as set forth in claim 1, wherein the first concave electrode of the first semiconductor chip is formed along an inner wall surface of a hole which extends from the rear surface of the first semiconductor chip to the first electrode pad of the first semiconductor chip,
the second concave electrode of the first semiconductor chip is formed along an inner wall surface of a hole which extends from the rear surface of the first semiconductor chip to the second electrode pad of the first semiconductor chip,
the first concave electrode of the first wiring substrate is formed along an inner wall surface of a hole which extends from the rear surface of the first wiring substrate to the first electrode pad of the first wiring substrate, the third concave electrode of the first wiring substrate is formed along an inner wall surface of a hole which extends from the rear surface of the first wiring substrate to the second electrode pad of the first wiring substrate, and the second concave electrode of the first wiring substrate is formed along an inner surface of a hole which extends from the rear surface of the first wiring substrate to the principal surface of the first wiring substrate.

8. A semiconductor device as set forth in claim 1, wherein the first semiconductor chip has an external size which is larger than that of the second semiconductor chip.

9. A semiconductor chip as set forth in claim 1, wherein the first semiconductor chip has an external size which is smaller than that of the second semiconductor chip.

10. A semiconductor device as set forth in claim 1, wherein the first semiconductor chip has a second concave electrode formed on the ear surface side thereof; the second semiconductor chip has a second electrode pad formed on the principal surface thereof; and a second protrusion electrode formed on the second electrode pad, and the first wiring substrate has a second electrode pad and a third electrode pad formed on the principal surface side thereof, and a third concave electrode having a recess formed from the rear surface side thereof to the second electrode pad, and connected to the second electrode pad, a second protrusion electrode formed on the third electrode pad, and a second wiring formed on the rear surface thereof; for electrically connecting the second electrode pad with the third electrode pad, a part of the second protrusion electrode of the first wiring substrate is press-fitted in the recess of the second concave electrode of the first semiconductor chip through deformation caused by plastic flow, and a part of the second protrusion electrode of the second semiconductor chip is press-fitted in the recess of the third concave electrode of the first wiring substrate through deformation caused by plastic flow.

11. A semiconductor device as set forth in claim 10, wherein the first wiring is thicker than the second wiring.

12. A semiconductor chip as set forth in claim 10, wherein the first wiring is a power source wiring, and a second wiring is a signal wiring.

* * * * *